US008341837B2

(12) United States Patent
Braunstein et al.

(10) Patent No.: US 8,341,837 B2
(45) Date of Patent: Jan. 1, 2013

(54) MODULAR POWER DISTRIBUTION AND CONTROL SYSTEM

(76) Inventors: Zachary L. Braunstein, San Marcos, CA (US); Frederick Y. Mah, San Diego, CA (US)

( * ) Notice: Subject to any disclaimer, the term of this patent is extended or adjusted under 35 U.S.C. 154(b) by 1062 days.

(21) Appl. No.: 12/148,771

(22) Filed: Apr. 22, 2008

(65) Prior Publication Data

US 2008/0291607 A1 Nov. 27, 2008

Related U.S. Application Data

(60) Provisional application No. 60/931,792, filed on May 25, 2007, provisional application No. 61/002,964, filed on Nov. 14, 2007.

(51) Int. Cl.
*H01R 43/00* (2006.01)
*H05K 13/00* (2006.01)

(52) U.S. Cl. ................ 29/854; 29/593; 29/622; 29/832; 307/31; 361/641; 324/508; 439/215

(58) Field of Classification Search .................... 29/593, 29/622, 832, 854, 874; 307/31; 361/641, 361/643, 652; 324/508, 531; 439/215
See application file for complete search history.

(56) References Cited

U.S. PATENT DOCUMENTS

| | | | | |
|---|---|---|---|---|
| 6,380,862 | B1 * | 4/2002 | Karim et al. | 340/635 |
| 6,538,421 | B1 * | 3/2003 | Carpenter | 324/127 |

* cited by examiner

*Primary Examiner* — Derris Banks
*Assistant Examiner* — Jeffrey T Carley

(57) ABSTRACT

The invention describes apparatus for designing and installing power distribution systems for: residential, commercial and industrial applications, as well as for power distribution within electro-mechanical devices. The invention transforms existing labor-intense installations into practically plug-and-power type modular systems. For a specific project, pre-designed, fabricated and tested kit, including factory assembled and tested: power and control enclosures, power outlets and junction boxes, interface cables, as specified by the invention, will be delivered directly to the installation site. No labor intense operations: wire crimping, outlet/switch wiring, junction box wiring, load wiring. No exposed hot wires or leads at any point outside enclosure. The invention will: significantly lower labor costs, reduce installation time, improve safety, reliability and quality. Utilization of shielded cables and shielding of other components within a system, will significantly lower electrical power emissions, benefiting the environment for all—the end users and other technologies.

14 Claims, 25 Drawing Sheets

MODULAR POWER DISTRIBUTION AND CONTROL SYSTEM

CROSS-REFERENCE TO RELATED APPLICATIONS

Figure 1:
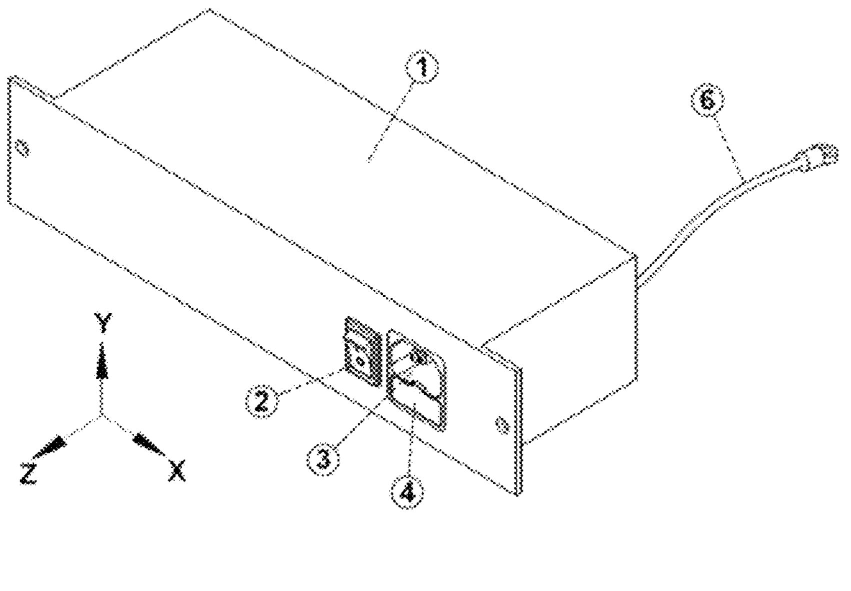

We claim the benefits of Provisional Application No. 60/931,792 filed on May 25, 2007, title "Modular power distribution and interface system", and Provisional Application No. 61/002,964 filed on Nov. 14, 2007, title "Modular power distribution and control system".

STATEMENT REGARDING FEDERALLY SPONSORED RESEARCH OR DEVELOPMENT

Not applicable.

REFERENCE TO SEQUENCE LISTING, A TABLE, OR A COMPUTER PROGRAM LISTING COMPACT DISK APPENDIX

Not applicable.

BACKGROUND OF THE INVENTION

A majority of hi-power AC electrical wiring of residential and commercial structures, as one of important steps in providing completed structure with required power, has fallen drastically behind the progress attained in other areas of construction, such as: wiring for communications, including phone lines, LAN, internet, etc. Based on existing methods of wiring AC electrical power, the installation time, installation quality, reliability, repeatability and end-result safety of installations—depends heavily on hi-skill manual labor. As result, overall quality of each practical installation is at a mercy of an installation crew, which must maintain required: workmanship skills; detailed attention to specifications, including wiring diagrams, which are more complex these days due to demands for larger and sophisticated structures; installation quality at a rather intensive schedule of completion; etc. In addition to problems stated above, the associated costs of electrical power wiring of a structure—is constantly going up, not so much due to better quality of materials, but rather due to increases in labor costs.

While demand for new construction varies, and respective builders could complete them at rather comfortable time schedules, there is a high demand currently in the areas within the U.S.A. affected by devastating flooding and fires. These re-building projects, which should be completed as soon as possible, could not afford, for example, extra expenses associated with paying high rates for expediting installations of electrical power.

While the costs of building materials in general went up significantly, and while the buildings themselves have appreciated substantially, the existing electrical components and technology used for wiring electrical power has remained disproportionably behind. The existing technology is utilizing primarily individual wires, not cables, and as result, it would be rather challenging to reduce electromagnetic interferences produced by power devices and propagated along these wires, which could: present health risks to individuals near by; and impact operating environment for other devices.

The existing technology places a burden on an installer to implement a required load switching scheme. Some of the switching schemes could be rather complicated, and as result, have a higher risk of mistake made by installer, which may not be discovered by installation inspector, and those impacting the quality and safety of an installation.

In addition, a majority of electrical and electro-mechanical equipment, including machinery and stand alone devices, require adequate means for connecting to required electrical power sources. For simplicity, the applicable equipment in this application will be referred as device.

There are a number of applications, where electrical power to devices is provided via interface modules, including ones that resemble a standard power strip. There is a range of equipment, such as ATM machines, Vending machines, and Process machines in general, etc., that could be considered a main device, which could incorporate other secondary devices within them, such as: display monitor, printer, etc., which also require electrical power applied to them.

The existing power entry methods, although being adequate in electrical power ratings, are not conveniently packaged to provide cost-efficient power entry from outside power source to the main device and then power distribution within the main device to secondary devices. Simply put, there is no off-the-shelf solution, which would conveniently interface a main device to a power source, and then provide convenient power distribution within the main device to other secondary devices.

As a result, designers of main devices have little choice, but to employ a number of off-the-shelf individual components, such as: power inlet, power protection, etc. interfaced via custom wiring, packaged in custom housings, etc., which potentially could create unnecessary challenges in meeting respective safety agency requirements, such as UL, and others. In addition, any "in-house" custom wiring of power components within or outside a device, due to possible lack of solid quality control procedures, which, in contrast, are enforced on off-the-shelf components, could represent a potential safety hazard for individuals responsible for device operation and maintenance.

The existing power entry and distribution methods for a number of devices do not provide convenient power monitoring and diagnostics to ensure the respective device(s) performance has not degraded below projected levels, which if not noticed and then timely attended to by conducting required maintenance, etc., could costs the user of the device in terms of: higher energy costs, potential loss of a device, etc.

The existing power entry and distribution methods do not provide a cost efficient solution to the growing demands for devices aimed at automating a number of businesses, such as: grocery, retails, etc.

BRIEF SUMMARY OF THE INVENTION

This application covers a "Modular Power Distribution and Control System" (MPD&CS), which provides a comprehensive system level solution to current and future requirements in regard to:

1) Electrical power wiring, power distribution, power monitoring of structures, which could include: residential, commercial, and industrial
2) Electrical power entry, power distribution, monitoring and control for variety of devices, such as: electro-mechanical machines, self-check-out machines, etc, For power distribution designs for industrial, commercial and residential applications—the new technology represents a giant step forward in terms of:

a) Superior level of quality and safety.

Only standard, agency approved, pre-assembled, tested, and inspected Modules could be used, without a single custom-made wire on outside, or a custom connection required. All components and Modules could be assembled at the factory with required level of automation to ensure repeatable quality for every installation regardless of size, complexity, location or time schedule. All components and Modules could be agency pre-approved. All pre-assembled Modules could be tested to the highest safety levels, including hi-pot, etc. Since the proposed technology could utilize described in this application Plug-n-Power methods, and together with Power-Safe or Plug-n-Safe Interfacing, based on standard cables instead of individual wires, the entire installation could be significantly safer and more reliable compared to any existing methods. As required, a section of a system or an entire system, consisting of modules, devices and components, could be shielded to isolate the environment from power related electro-magnetic interferences, and result, could improve operating environment for other devices, as well as reduce safety health hazard on individuals near by. As required, a section or an entire system could be designed to confirm with respective environmental conditions. All existing power control, switching schemes, together with a new requirements, could be implemented via standardized Modules, which could be assembled-tested-inspected individually, and then inter-connected as required to implement the desired switching combination, and tested-inspected at the factory, prior for shipping as a kit to an installation location with clear instructions for ease of installation.

b) Exceptional efficiency and effectiveness.

For each new or existing project, regardless of complexity of a custom design or a track development, a pre-manufactured kit, which could include—all essential power distribution, interface and control components and Modules—could be prepared, tested, inspected and delivered to the construction site, as needed. The installation, approaching industry term "plug-n-play", with simple point-to-point connections via standardized cables, could significantly lower the time to complete the wiring of a structure, with no compromise in quality or safety. In addition, the overall layout and workmanship for any track development, would be highly consistent, which could important for future expansion, modifications, etc. With adequate automation at the factory producing required components and Modules, the costs of materials could be less affected by labor disputes or other factors.

The bottom line—the proposed new technology could advance the electrical power wiring of structures to a required level, so that support of new construction, as well as re-build of structures damaged, could be accomplished in a most effective and efficient way.

For designs of: electrical power entry, power distribution, monitoring and control—for a variety of systems, devices, apparatuses, MPD&CS, which could consist of existing and unique components, which could be packaged as a module, or a number of modules, could:

a) Provide a more convenient and cost-efficient power connection to a main device, and then power distribution within the main device to other devices, as needed, as well as to provide convenient interface for other functions, such as network connection, etc. The packaging of each module could be made out of metal or plastic, with overall package design meeting respective agency regulation requirements.

b) Be configured and/or expanded, as needed, to include a required number of Outlets for power distribution within the main device to other secondary devices, as well as to conveniently accommodate interface to other outside sources or devices, which could include network connections and others.

c) Consist of components, such as power disconnects, power safety, etc., which could be conveniently located throughout the main device to provide the most effective power distribution and safety features, as needed.

d) Have all related components manufactured as a standard set of modules, and approved by respective safety agencies, such as UL, etc. The MPD&CS and all related components have an opportunity to become industry standards for power entry and power distribution within a main device, simplifying designs, lowering associated costs, and providing direct compliance to respective safety regulations.

e) Include components and modules, which could be mounted at various locations within the main device, could be interfaced via industry standard power cables, the specifications of which (length, ratings, quality, etc.) could be selected to meet respective safety requirements. This could, potentially, completely eliminate the existing methods of custom cut, prepped and wired power cables within the main device.

f) Significantly improve safety and reliability of power wiring inside a device or a machine, by utilization of Power-safe or Plug-in-Safe interface technology g) Reduce electro-magnetic interferences of power distribution lines by employing pre-made shielded cables h) Employ respective technologies in conducting required power monitoring and self-diagnostics of respective components with an objective to alarm the users of possible degradation of: device, component, connection, etc. which could negatively impact the business in terms of costs due to: excessive energy consumption, process costs due to device mal-function, etc. These intelligent components or modules could be set or programmed to disconnect a device or number of devices, which have exceeded one or more of monitored power parameters, such as: power consumption, power factor, power quality, etc., to avoid the negative impact of a potentially faulty device on business performance.

In summary, the MPD&CS could become an industry leading equipment power-entry and distribution method, which could accomplish, among others, three very important objectives:

1) Lowering costs (installation, operation, maintenance) for providers of the respective devices
2) Improving respective products, overall systems reliability and safety, by standardizing the methods and principals of power entry and distribution
3) Improving business performance by self-monitoring power quality and power consumption parameters, and making real-time intelligent corrective decisions to minimize impact of aging or faulty devices on respective processes In addition, MPD&CS could employ respective technologies in conducting required Power Monitoring and self-diagnostics of respective components with an objective to alarm the users of possible degradation of: device, component, connection, etc. which could negatively impact the operating electrical costs due to: excessive energy consumption, process costs due to device mal-function, etc. These intelligent components or Modules could be set or programmed to disconnect a device or number of devices, which have exceeded one or more of monitored power parameters, such as: power consumption, power factor, power quality, etc., to avoid the negative impact of a potentially faulty device on business performance.

BRIEF DESCRIPTION

Drawing Content and Listing

Our application contains drawings listed in Table 1, below.

TABLE 1

List of Drawings.

| FIG. | Description |
|---|---|
| 1 | 3-D view of PEM with local power disconnect component (switch), power conditioning component (EMC filter), over-current protection component (fuse) |
| 2 | Top view of PEM with local power disconnect component (switch), power conditioning component (EMC filter) and over-current protection component (fuse) |
| 3 | View from the power entry side of PEM with local power disconnect component (switch), power conditioning component (EMC filter), over-current protection component (fuse) |
| 4 | View from power distribution side of PEM with local power disconnect component (switch), power conditioning component (EMC filter), over-current protection component (fuse) |
| 5 | 3-D view of PEM with: local power disconnect component (switch), power conditioning component (EMC filter), over-current protection component (fuse); interface for a remote module; interface for wired LAN |
| 6 | View from power entry side of PEM with: local power disconnect component (switch), power conditioning component (EMC filter), over-current protection component (fuse); interface for remote module; interface for wired LAN |
| 7 | Top view of PEM with: local power disconnect component (switch), power conditioning component (EMC filter) and over-current protection component (fuse); interface for remote module; interface for wired LAN |
| 8 | View from power distribution side of PEM with: local power disconnect component (switch), power conditioning component (EMC filter), over-current protection component (fuse), dual power Outlet section switched ON/OFF locally; section for interface to remote module, off-set for clear distinction; dual power Outlet section switched ON/OFF locally or remotely; interface for wired LAN |
| 9 | View from the power entry side of PEM with local power disconnect component (switch), power conditioning component (EMC filter), over-current protection component (fuse), overall/central device power monitoring and diagnostics component (embedded controller) with hi-speed power-line data communication interface to remote modules within and outside main device |
| 10 | PEM wiring diagram: local power disconnect component (switch), power conditioning component (EMC filter), over-current protection component (fuse), four power Outlets switched ON/OFF |
| 11 | 3-D view of RM with: power disconnect/over-current protection component (breaker switch), Inlet port power conditioning component (EMC filter) and Outlet component |
| 12 | Operator side view of RM with: power disconnect/over-current protection component (breaker switch), Inlet port power conditioning component (EMC filter) and Outlet component |
| 13 | Bottom view of RM with: power disconnect/over-current protection component (breaker switch), Inlet port power conditioning component (EMC filter) and Outlet component |
| 14 | 3-D view of RM with: power emergency push-pull disconnect component (E-stop switch), Inlet component and Outlet component |
| 15 | Top view of RM with: power emergency push-pull disconnect component (E-stop switch), Inlet component and Outlet component |
| 16 | Operator view of RM with: power emergency push-pull disconnect component (E-stop switch), Inlet component and Outlet component |
| 17 | Operator side view of RM with: power disconnect/over-current protection component (breaker switch), Inlet port power conditioning component (EMC filter), Outlet component, Outlet power monitoring and diagnostics component (embedded controller) with hi-speed power-line data communication to central power monitoring and diagnostics component of the entry module |
| 18 | RM wiring diagram: power disconnect/over-current protection component (breaker switch), Inlet port power conditioning component (EMC filter), Outlet power monitoring and diagnostics component (embedded controller) with hi-speed power-line data communication interface to central power monitoring and diagnostics component of the entry module, Outlet component |
| 19 | 3-D view of MPD&CS for a Main Device with Secondary Devices: Computer, Touch-screen LCD, Printer; Remote Module with Remote Switch and Protection; Power strip component |
| 20 | 3-D view of MPD&CS with centralized and remote power monitoring, diagnostics and control for a Main Device with Secondary Devices: Computer, Touch-screen LCD, Printer, two Conveyors with respective Controllers. |
| 21 | Wiring diagram of MPD&CS for a Main Device with Secondary Devices switched and protected locally: Computer, Touch-screen LCD, Printer. |
| 22 | Wiring diagram of MPD&CS shown on FIG. 1 |
| 23 | Wiring diagram of MPD&CS shown on FIG. 2 |
| 24 | Single Switch Lamp Fixture Wiring |
| 25 | 2-way Lamp Fixture Switching Wiring |
| 26 | 2-way Lamp Fixture Switching Logic Schematic |

TABLE 1-continued

List of Drawings.

| FIG. | Description |
|---|---|
| 27 | Components Symbols |
| 28 | Power Distribution and Control 115 VAC/230 VAC System |
| 29 | 3-D View Dual 115 VAC 15 A Feed-through Outlet Module |
| 30 | 3-D View Dual 115 VAC 20 A Outlet Module |
| 31 | Top View Dual 115 VAC 15 A Feed-through Outlet Module |
| 32 | Bottom View Dual 115 VAC Feed-through 15 A Outlet Module |
| 33 | Front View Dual 115 VAC Feed-through 15 A Outlet Module |
| 34 | Side View Dual 115 VAC Feed-through 15 A Outlet Module |
| 35 | Front View Dual 115 VAC 20 A Outlet Module |
| 36 | Side View Dual 115 VAC 20 A Outlet Module |
| 37 | Top View Dual 115 VAC 20 A Outlet Module |
| 38 | 3-D View Single Switch Feed-through 115 VAC 15 A Module |
| 39 | Front View Single Switch Feed-through 115 VAC 15 A Module |
| 40 | Side View Single Switch Feed-through 115 VAC 15 A Module |
| 41 | Bottom View Single Switch Feed-through 115 VAC 15 A Module |
| 42 | Top View Single Switch Feed-through 115 VAC 15 A Module |
| 43 | Power Distribution Module 115 VAC/230 VAC 15 A |
| 44 | 3-D View Electrical Panel - Front Cover Assembly |
| 45 | 3-D View Electrical Panel - Front Cover Removed |
| 46 | Front View Electrical Panel - Front Cover Removed |
| 47 | Top View Electrical Panel |
| 48 | Front View Electrical Panel |

DRAWING CONVENTION AND FORMAT

Drawings with this application, in addition to USPTO requirements, are:

a) Not to scale.

b) Referenced to "X-Y-Z" coordinate system, which is consistent throughout all Drawings.

DEFINITIONS

Our application contains definitions of specific components or processes, which are scripted in "bold italic", and listed below in alphabetical order.

Notes:

1. All materials, components, Modules, process, etc. defined and/or described in these applications, are to comply with respective agency, national and/or local, in regard to safety, and other respective regulations.
2. While for simplicity majority of illustrations are based on power distribution of 115 VAC, the proposed methods and technology could be successfully used for power distribution of 230 VAC, and other voltage systems, as needed.
3. All materials, components, Modules, etc. could have proper agency approvals, and to could be used according to their manufacturer's approved specifications, including: power rating, environment, etc.
4. All power cable connection to have agency required safety connectors, and when connected, shall have a proper strain-relief provided
5. All components, including cables, Modules, etc. could be designed to reduce electromagnetic interferences (EMI) produced by power devices, and could: reduce health risks to individuals near by; improve operating environment for other devices.
6. Modules could be designed with their respective power connections located such as to accommodate the most cost efficient wiring during installation and/or convenient connection of devices by users.
7. Since the proposed technology for interfacing between all Modules could utilize only standard cables instead of individual wires, these cables could be shielded, as needed.
8. Each Module could be designed to be housed inside an enclosure, with only input power plug or plugs and output power receptacle or receptacles exposed outside enclosure. Module's mounting hardware and Earth ground wire could be the only components exposed, as needed. As needed, enclosures could be made out of metal, which together with proper use of shielded cables and proper Earth grounding—could ensure the environment surrounding each Module, component or cable, could be free of EMI and static charge.
9. Each Module and component, as required by local or national safety code, could have a designated Earth ground wire connected to it's enclosure, and which could be used for connecting to Earth ground during installation.
10. All Modules and components of the proposed technology designed to implement existing power switching schemes, such as: 2-way switching, 3-way switching, etc. could all be fabricated-tested-inspected at the factory, and shipped to destination with clear instructions for ease of installation.
11. All Modules and components could have required label, which could represent: power rating; functional application; operating environment; etc. Label information could be designed as required to meet respective safety agency regulations.
12. Illustrated orientation of components, number and/or location of power inlets and outlets, etc. serves to demonstrate the principals of this application, and could be changed, as needed, for any specific application.
13. As shown, per respective national and local safety regulations—both NEMA and/or IEC type interface connections could be used for wiring 115 VAC and 230 VAC devices.
14. Although due to simplicity a limited variety of power interface connectors are shown in this application, the proposed principals could allow utilization of a wide variety of power connectors approved by respective safety agency, and could include twist-lock type, and others, for a more reliable connections.

Definitions:

Control Module

An intelligent device, which could be a local or remote computer, which could be assigned among other functions, to interface to Local and Remote Diagnostics of a Main Device(s), and to monitor and control power distribution within Main Device(s), based on performance criteria set by business Distribution Module Could be defined as a Module, which could contain components, which could include: one plug for accepting power and a number of output receptacles for distribution of connected power to other Modules or components plugged into its output receptacles.

Entry Module

Could be defined as the Module, which could accommodate connection of the Main Device and its Secondary Devices to AC power source. Entry Module could also provide such functions, as: AC power safety disconnect, AC power conditioning, etc. In addition, Entry Module could be used for convenient interface of wired LAN, etc. Main Device could have several Entry Modules, as needed. Entry Module in this application is also referred to as PEM.

NOTE: For simplicity, the examples of Entry Modules presented in document "Drawings" are for illustration purposes of respective principals, while the actual layout, arrangement of components—could be changed to meet requirements of a specific application.

Entry Plug

One of the components of Entry Module, which could be an industry standard component or module for connecting power cord to the Main Device. The Entry Plug could be selected to meet specific device power ratings and configured per respective power distribution standards, such as: NEMA, IEC, etc. For simplicity, Entry Plug is shown as IEC 60320-C14 type. As needed, the Entry Plug could be an integral part of Local Conditioning component Local Outlet One of the components of Entry Module, which could be used for power distribution to other Modules and/or Devices within the Main Device. For simplicity, Local Outlets are shown as IEC C13 type, but depending on application could be any respectively approved Outlet.

Local Switch

One of the components of Entry Module, which could be an industry standard component or module, and could serve as the main disconnect of incoming power, which could be located conveniently next to the Entry Plug. Depending on specific safety requirements, Local Switch could be single or multi-pole disconnect switch, or remotely controlled single or dual-pole relay. Local Switch type (toggle, push-pull, illuminated, etc.) could be selected per respective functional and safety regulation requirements.

Local Protection

One of the components of Entry Module, which could be an industry standard component or module, which could be a part of Local Switch module or Entry Plug module, and which could serve as the main over-current protection. In addition, Local Protection module could also employ over-voltage protection, etc. Depending on specific safety requirements, Local Protection could be single or multi-pole protection. Local Protection type (fuse, circuit-breaker, etc.) could be selected per respective functional and safety regulation requirements.

Local Conditioning

One of the components of Entry Module, which could be an industry standard component or module, which could be a part of Entry Plug, and could serve any combination of the following functions: incoming power conditioning, suppression of noise coming out of the device, etc.

Local Diagnostics

One of the components of Entry Module, which could be an industry standard component or module, which could employ intelligent power monitoring/control components, and which could serve as: visual and/or audible indicator, representing specific state of the power at an Entry Module; and which could communicate via hi-speed power-line data interface with Remote Module(s), as needed, to sustain safe and efficient operation of Main Device, and Secondary Devices within it.

Local Controller

One of the components of Entry Module, which in addition to Diagnostics, could perform control functions of Remote Module(s), and control could be as simple as turning ON/OFF a smart relay, or as complicated as real-time interaction via hi-speed power-line data communication interface with other Controller(s), such as: motion, temperature, etc., which could reside within a Module or be connected to Remote Module, or Remote Controller, as needed, to sustain safe and efficient operation of Main Device, and Secondary Devices within it. Local Controller, as needed, could be connected within Entry Module in such a manner, so when power is disconnected due to emergency, or any other reasons, the power line communications between Local Controller are intact to sustain required data and control information exchange with other Controllers.

NOTE: As needed, the Local Controller could have non-volatile memory, battery back-up and other features, and could be wired in a such a matter (i.e. parallel to power lines, etc.), that could allow it to perform other functions, such as: recording data preceding power failures related to Main Device, power outages, over-current conditions, etc, which could be then communicated to other Controllers or computers over Module Networking and/or dedicated communication networks (i.e. serial, LAN, etc.), and respective data could be used to analyze the performance of Main Device with objectives to prevent unnecessary failures, excessive use of power, etc.

Main Device

Could be defined as a stand-alone device, equipment, machine, etc, which could be powered by an AC power source, and could consist of other stand-alone devices within itself, which could be powered by AC power source. Example of Main Devices: ATM machines, Vending machines, Process machines in general, etc.

NOTE: For simplicity, the examples of Main Devices presented in document "Drawings" are for illustration purposes of respective principals, while the actual layout, arrangement of Devices, Modules and components—could be changed to meet requirements of a specific application.

MPD&CS

For designs of wiring industrial, commercial and residential applications, Modular Power Distribution and Control System could be defined as a System, which could consist of: all Modules, devices, components, interfaces, etc., which are defined and described in this application, together with applicable industry-standard components, which fall within required specifications for an MPD&CS type installation. MPD&CS methods and technology could provide superior quality, reliability and efficiency compared to any existing power distribution methods.

For designs of power distribution systems for devices, Modular Power Distribution and Control System could be defined as a System, which could consist of an Entry Module(s) and a number of optional Modules, Local and Remote, installed within a Main Device, and which could provide such functions within the Main Device, as: AC power entry, AC power safety disconnect, AC power conditioning, AC power distribution to Secondary Devices, AC power monitoring and control, etc. As needed, MPD&CS could also serve as a convenient interface housing for connecting the Main Device and its respective Secondary Devices to outside devices via wired-type LAN, etc.

NOTE: All components employed in the design of MPD&CS could be considered to:

1) Comply with respective safety agency regulations and local safety requirements
2) Could be individually approved by respective agency
3) Could be manufactured and sold, as a component, with appropriate label, reflecting among other things, component rating and approvals Module Controller Could be defined as a component, which could be installed inside a Module, or attached to a Module, and which could provide one or combination of any of the following functions:

a) Monitoring total power consumption by the entire Module, or by a selected section of a Module
b) Wired or wireless interface for—remote diagnostics, data transfer, remote control—by designated Controller Module, or remote Controller, which could include one from an Utility company
c) Monitoring parameters, including—quality of incoming power; utilized power efficiency (power factor, etc.)
d) Providing local user interface for: setting specific limitations on monitored parameters and reporting when the limits have been exceeded; setting up controls, when a specific limit or a number of selected limits have been exceeded, and control could automatically disconnect the power to respective loads connected to Module Module Controller could be designed based on an embedded Controller, and could have user interface, which could be in a form of a LCD with few entry buttons, or ATM type touch-screen display, etc. Module Controller could present on its display important parameters in terms of power utilization and efficiency, or display any number of monitored parameters, selected by a user.

Module Interface

Could be defined as interface cabling between various Modules and/or Devices within a MPD&CS, and which could be entirely based on industry standard off-the-shelf components, such as power cables, and which could be approved by respective safety agencies for specific applications.

NOTE: For simplicity, examples presented in document “Drawings” are based on utilization of properly rated and approved industry standard IEC power cords for power distribution and power line networking of respective Devices and Modules.

Sections of the Module Interface, which could be dedicated to Devices only, could be referenced as Device Interface.

Module Networking

Could be defined as interconnections of various Modules and/or Devices within Main Device via Module Interface, and which could be used for: power connection, data and/or control exchange between Controllers and/or Devices connected, etc. The diagnostics/control communication between Modules could be accomplished via: existing or newly developed power line communication technologies over power line cables; high-speed interfaces, such as serial RS-232, USB, etc.; etc.

NOTE: One of the important features of the MPD&CS is its ability to interface Modules, Local and Remote, including Controllers, and/or Devices via standard off-the-shelf power cables, which in addition to providing the basic power, could also employ respective existing and new power line communication technologies to successfully carry the hi-speed data communication interface between respective Diagnostics and Control components, which could be strategically embedded inside respective Modules. Module Networking could be accomplished via power lines, and Controllers could be interconnected in a such manner, so when power is disconnected due to emergency, the power line communications are intact to sustain required data and control information exchange between respective Controllers, as needed. Sections of the Module Networking, which could be dedicated to Devices only, could be referenced as Device Networking.

Module Packaging

Each module of the MPE&IS could be designed to meet respective agencies regulations and requirements, which could be reflected in proper selection of: packaging and interface materials; components, including interface wiring and terminations; clearances and creepages between power components; etc. In addition, Module Packaging design could be optimized in terms of its: size, weight, components mounting, appearance, costs, etc. to set an industry standards for volume production.

Panel Module

Could be defined as a main power distribution Panel, which could replace the existing technology electrical panels, and which could interface to all Secondary Devices via standard cables. A Panel Module, including all components such as Panel enclosure and/or housing, Power Receptacles, interface cables, etc. could use weatherproof versions of these components, as needed. A Panel Module, depending on rated power (voltage, current), could have industry standard Power Receptacles, providing required power to Secondary Devices. Example for 115V/230 VAC power distribution: NEMA 5-15R for 115 VAC/15 A; NEMA 5-20R for 115 VAC/20 A; NEMA 6-20R for 230 VAC/20 A. As needed, the entire Panel Module could be shielded to provide required levels of environmental protection Panel Controller Could be defined as a Module, which could be installed at a Panel Module, and which could provide one or combination of any of the following functions:

a) Monitoring total power consumption by the Panel Module
b) Wired or wireless interface for—remote diagnostics, data transfer, remote control—by designated Controller Module, or remote Controller from an Utility company
c) Monitoring parameters, including—quality of incoming power; utilized power efficiency (power factor, etc.)
d) Providing local user interface for: setting specific limitations on monitored parameters and reporting when the limits have been exceeded; setting up controls, when a specific limit or a number of selected limits have been exceeded, and control could automatically disconnect the power to respective Secondary Devices Panel Controller could be designed based on an embedded Controller, and could have user interface, which could be in a form of a LCD with few entry buttons, or ATM type touch-screen display, etc. Panel Controller could present on its display important parameters in terms of power utilization and efficiency, or display any number of monitored parameters, selected by an user.

Plug-n-Play Assembly

Could be defined as a process of assembling MPD_CS for any given application, which could be truly described as a Plug-n-Play step-by-step process, utilizing only off-the-shelf pre-approved Modules and components. For the majority of applications, the Plug-n-Play Assembly process of a rather complicated Device, could be accomplished in a matter of minutes versus hours, which are currently required using existing methods based on custom designs and assembly processes.

Plug-n-Power

Could be defined as a method of designing power distribution systems based on MPD_CS principals, which could be accomplished based on standardized, agency approved interface components and cables, which could be pre-manufactured and tested at a designated factory, and then delivered and installed at a construction site, or an installation facility without a need for a single wire cut or crimp, those providing exceptional quality, reliability, safety and minimize electromagnetic emissions from cycling power lines Plug-n-Safety Could be defined as a method of interfacing power distribution and control Modules, devices, Components, etc. described in this application via pre-manufactured, agency approved cables, which could allow direct plug-in interface between all devices within a system, and as result—offer unprecedented safety by eliminating presence of bare wire, terminal or any metal, which could carry a line voltage.

Power-Proof

Could be defined as a method of designing power distribution systems based on MPD_CS principals, utilizing standardized interface methods, which eliminate any metal component, including: bare wire, terminals, etc., which could potentially carry line voltages, or health hazard signals, from being exposed outside an enclosure or module, and as result, could substantially improve safety during installation, utilization and maintenance. Could also be referred as Power-Safe Remote Module Number of components, grouped inside a Module, which could be located apart from the Entry Module within or outside a Main Device, and which could provide the following functions: remote AC power safety disconnect, remote AC power conditioning, Remote Diagnostics, Remote Controller, etc. In addition, Remote Module could be used for convenient interface of wired LAN, etc. Main Device could have several Remote Modules, as needed.

Remote Plug

One of the components of Remote Module, which could be an industry standard component or module for connecting power cord to a Remote Module. The Remote Plug could be selected to meet specific device power ratings and configured per respective power distribution standards, such as: NEMA, IEC, etc. For simplicity, Remote Plug is shown as IEC C14 type. As needed, the Remote Plug could be an integral part of Remote Conditioning component Remote Outlet One of the components of Remote Module, which could be used for power distribution to other Modules and/or Devices within the Main Device. For simplicity, Remote Outlets are shown as IEC C13 type, but depending on application, could be any respectively approved Outlet.

Remote Switch

One of the components of Remote Module, which could be an industry standard component or module, and could serve as the main or secondary disconnect of incoming power, or disconnect of specific power distribution branch within the Main Device intended to power selected number of Secondary Devices. Depending on specific safety requirements, Remote Switch could be single or multi-pole disconnect. Remote Switch type (toggle, push-pull, illuminated, etc.) could be selected per respective functional and safety regulation requirements.

Remote Protection

One of the components of Remote Module, which could be an industry standard component or module, which could serve as main (in-place of Local Protection), or secondary (in addition to Local Protection), or stand-alone (protection of a specific power distribution branch within the Main Device). In addition, Remote Protection module could also employ over-voltage protection, etc. Depending on specific safety requirements, Remote Protection could be single or multi-pole protection. Remote Protection type (fuse, circuit-breaker, etc.) could be selected per respective functional and safety regulation requirements.

Remote Conditioning

One of the components of Remote Module, which could be an industry standard component or module, which could perform any combination of the following functions: incoming power conditioning, suppression of noise coming out of a device or number of devices, etc. Remote Conditioning could complement the Local Conditioning functions, and could serve to protect environments surrounding specific Secondary Device from possible power related noise, which could potentially impact the performance of that device. Remote Conditioning component could incorporate Remote Power Inlet plug.

Remote Diagnostics

One of the components of Remote Module, which could be an industry standard component or module, which could serve as a visual and/or audible indicator, representing specific state of the power at a location apart from an Entry Module. Similar to Local Diagnostics, Remote Diagnostics could employ intelligent power monitoring/control components, and which could serve as: visual and/or audible indicator, representing specific state of the power at a Remote Module in general, or specific power Outlet component of the Remote Module, and which could communicate with other Remote Module, as needed, to sustain safe and efficient operation of Main Device, and Secondary Devices within it.

Remote Controller

One of the components of Remote Module, which could be an industry standard component or module, which in addition to Diagnostics, could perform control functions of other Remote Module(s), or other components within Remote Module, or device(s) connected to Remote Module, and control could be as simple as turning ON/OFF a smart relay, or as complicated as real-time interaction via high-speed power-line data communication interface with another Controller (motion, temperature, etc.), connected to Remote Module, or Remote Controller, as needed, to sustain safe and efficient operation of Main Device, and Secondary Devices within it. Remote Controller, as needed, could be connected within Remote Module in such a manner, so when power is disconnected due to emergency, or any other reasons, the power line communications between Remote Controller are intact to sustain required data and control information exchange with other Controllers.

NOTE: As needed, the Remote Controller could have non-volatile memory, battery back-up and other features, and could be wired in a such a matter (i.e. parallel to power lines, etc.), that could allow it to perform other functions, such as: recording data preceding power failures related to Secondary Devices, power outages, over-current conditions, etc, which could be then communicated to other Controllers or computers over Module Networking and/or dedicated communication networks (i.e. serial, LAN, etc.), and respective data could be used to analyze the performance of respective Secondary Devices with objectives to prevent unnecessary failures, excessive use of power, etc.

Receptacle Module

Could be defined as a Module, which could contain components, which could include: one or more power input plugs, and one or more output receptacles.

Secondary Devices

For designs of wiring industrial, commercial and residential applications, Secondary Devices could be defined as Modules and components, which could be connected to Panel Module either directly via cable, or indirectly via other Modules. Example of Secondary Devices: Outlet Module; devices, such as lamp fixtures, etc. connected to Outlet Modules; Distribution Module; etc.

For designs of power distribution for devices, Secondary Devices could be defined as a stand-alone device, which could perform a specific function within a Main Device, and which could be powered via AC power means, including: AC/DC power bricks, etc., which could be connected to AC power distribution within the Main Device. Example of Secondary Devices: Printer, LCD monitor, Computer, etc.

NOTE: For simplicity, the examples of Secondary Devices presented in document "Drawings" are for illustration purposes of respective principals, while the actual layout, arrangement of Devices, Modules and components—could be changed to meet requirements of a specific application.

Switch Module

Could be defined as a Module, which could contain components, which could include: one or more power input plugs, and one or more output receptacles, with some or all of output receptacles controlled by a switch.

2-way Module

Could be defined as a Switch Module, which could be used in combination with another Switch Module for implementation of a 2-way switching of a load connected directly to one of the 2-way Modules, or indirectly connected via Receptacle Module, which in turn could be connected to a respective 2-way Module. As with many other currently used switching methods, the proposed technology could support these methods by utilization of standard switching Modules, which in contrast to existing technology, would be assembled-tested-inspected at the factory with clear labeling and instructions provided for ease of installation via standardized cables, which could be also assembled-tested-inspected at the factory. An entire power switching combination could be pre-tested and inspected at the factory prior to installation.

Project Kit

Could be defined as a Kit, which could be prepared, tested and inspected at a factory, per respective specifications of a power distribution project. The Kit could include: all required Modules and components, which could be labeled according to their ratings, functionality; detailed instructions for installation; factory test and quality reports; installation instructions and other helpful material, in support of efficient and effective installation for a given project; etc. As needed, the Kit could be shipped directly from the factory to installation site. Project Kits could be particularly useful for wiring projects, which are based on track-type development, i.e. consisting of repeatable construction sites. For these track-type installation, an initial Kit could be designed and filed-tested in terms of its performance, content, etc. Based on filed report, the Kit could be optimized, including: required Modules, Modules type, lengths of cables, etc. and then the optimized Kit could be delivered to remaining sites of a track-development for most efficient and effective installation.

Interface Module

Could be defined as a Module, which could be configured to provide a specific interface between the supply power connected to its incoming power plug or plugs and power available at respective power outlet or outlets. Interface Module could contain variety of components, which could include: incoming power inlet plugs, switches, outgoing power receptacles; Controller and its respective support components; etc. Interface Module could be standardized to provide a specific function, such as: 3-way switching, etc., and could also be used for custom-specific configuration, as needed. As with all Modules, Interface Modules shall comply with respective national and/or local safety and electrical code.

Power Feed-through

Could be defined as a method, which could allow an incoming power to a Module via power cable connected to a plug connector of the Module to be connected inside the Module directly to outgoing receptacle connector of the Module, so that a another power cable could be plugged into it to provide power to other Module or device, as needed.

Touch-proof Connections

Could be defined as power wire terminations, which have no exposed metal parts, such as bare wires, terminals, etc., which could carry high voltage power. Since the entire system could be assembled using factory terminated cables, all connections within MPD&CS could be touch-proof, significantly improving reliability and safety during installation, inspection, maintenance, etc.

DETAILED DESCRIPTION OF THE INVENTION

Notes:

1) For simplicity, the examples of Systems, Devices, Modules and components within them, presented in document "Drawings", are for illustration purposes of respective principals. The actual design, layout and arrangement—could be changed to meet requirements of a specific application.

Although the main intent of this application is to standardize respective principals of AC power entry, distribution and control within Structures and machines, and as a result, provide off-the-shelf cost effective solutions, still—customization of various elements could be accomplished within outlined principals, to further optimize the results for any given application, while retaining the essence of Plug-n-Play, Plug-n-Power and Power-n-Safety features.

2) For simplicity, optional features, such as: component shielding, grounding, strain-relief, environmental seals, etc. are not shown on all drawings FIG. 1 through FIG. 10 (5 pages)—illustrates various packaging configurations of Entry Module. The location of various components within Entry Module could vary to provide the most efficient and convenient access to the operator, as well as interfaces to other Modules or Devices.

Figure 2:
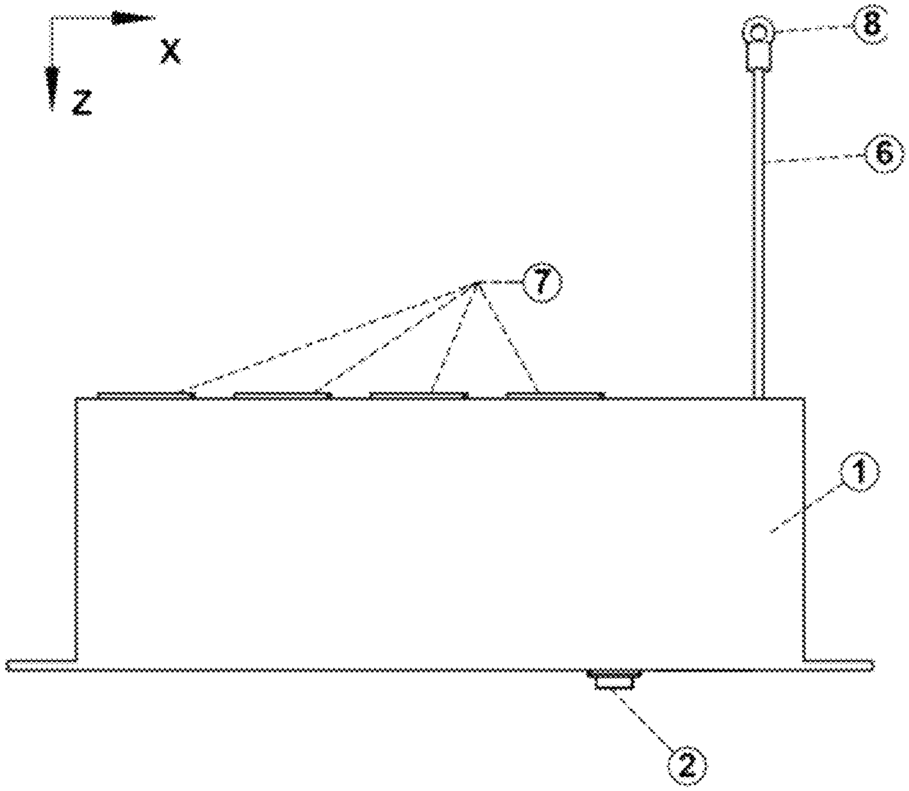
Figure 3:
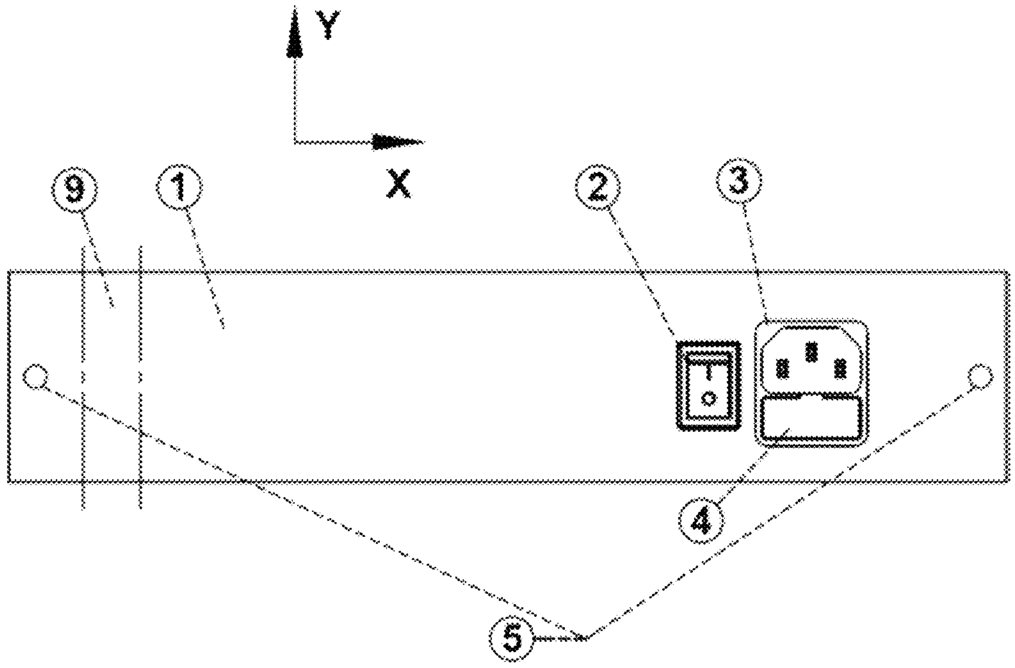

FIG. 1—3-D view of PEM (1) with Local Switch (2), Local Protection component—fuse holder with fuse inside (4)

FIG. elements are labeled as follows:

1—Power Entry Module (PEM), basic configuration

2—Incoming power Local Switch

3—Incoming power Inlet plug, which as an option, could be incorporated with power conditioning component—EMC filter (not shown)

4—Fuse holder with a fuse inside, which could be properly rated per given application

6—Earth ground wire, which is internally connected to incoming plug Earth ground terminal, and could serve as a convenient Earth ground termination for the Main Device FIG. 2—Top view of PEM illustrated on FIG. 1.

FIG. elements are labeled as follows:

7—Power distribution Outlets (4 shown), which could be controlled by main disconnect switch component of PEM (1)

8—Round terminal ring, part of Earth ground wire (6), which could be used for attaching the Earth ground wire to dedicated Earth ground stud of the Main Device Remaining elements are labeled same as on FIG. 1.

FIG. 3—View from the power entry side view of PEM illustrated on FIG. 1.

FIG. elements are labeled as follows:

5—Mounting holes for PEM

9—Section of PEM, which could be added to packaging, as needed, and which could be used for convenient housing of other interfaces (LAN, etc.) of the Main Device to/from outside devices, etc. Remaining elements are labeled same as on previous FIG.s.

Figure 4:
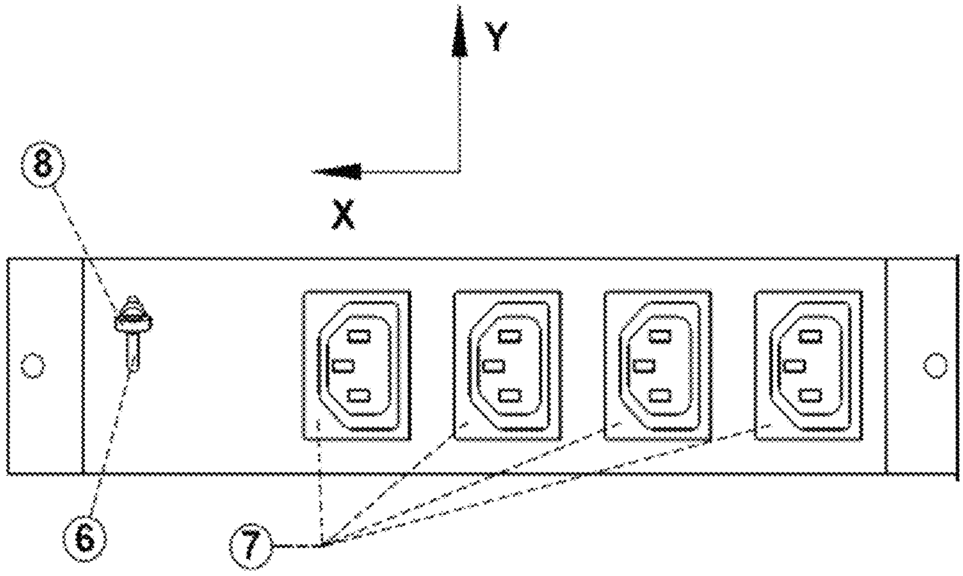

FIG. 4—View from power distribution side of PEM. Elements are labeled same as on previous FIG.s.

Figure 5:
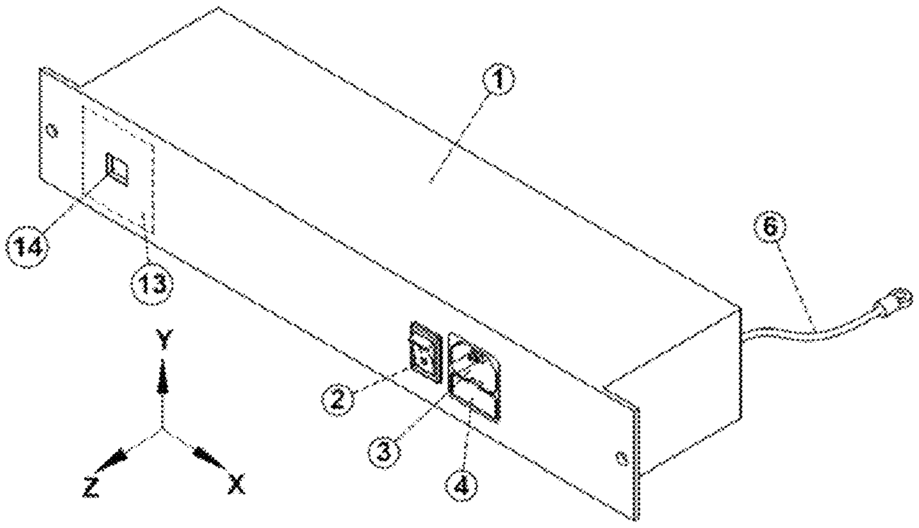

FIG. 5—3-D view of PEM with local power disconnect component—switch (2), over-current protection component—fuse holder with fuse inside (4), interface to Remote Module, LAN connection FIG. elements are labeled as follows:

13—Section of Power Entry Module, designed to house LAN interface related components

14—Interface connection for LAN network

Remaining elements are labeled same as on previous FIG.s.

Figure 6:
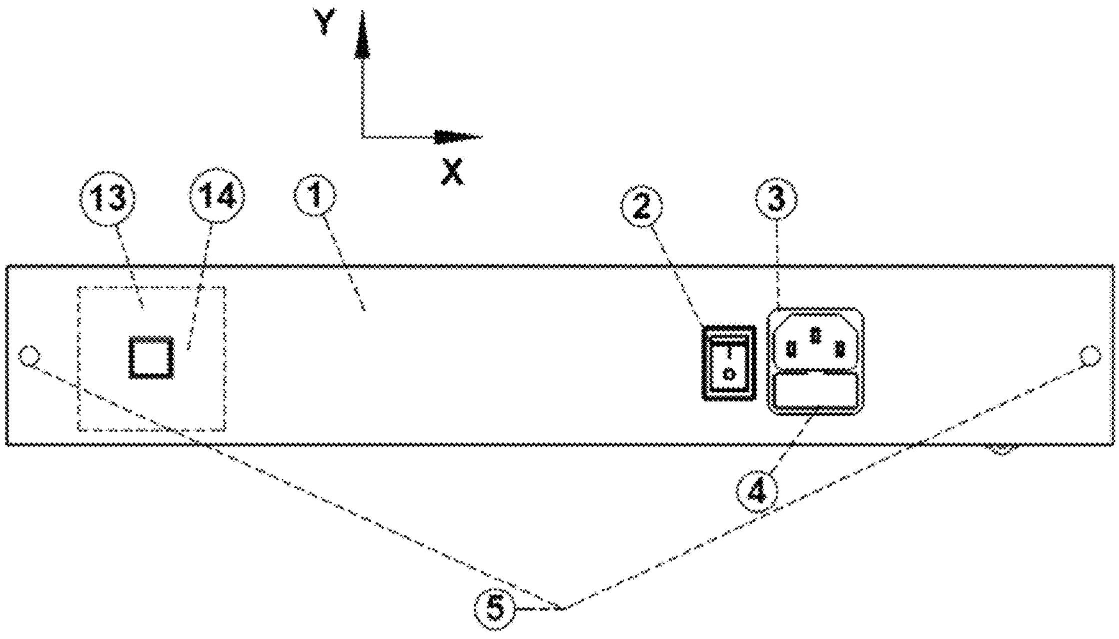

FIG. 6—View from power entry side of PEM shown of FIG. 5. Elements are labeled same as on previous FIG.s.

Figure 7:
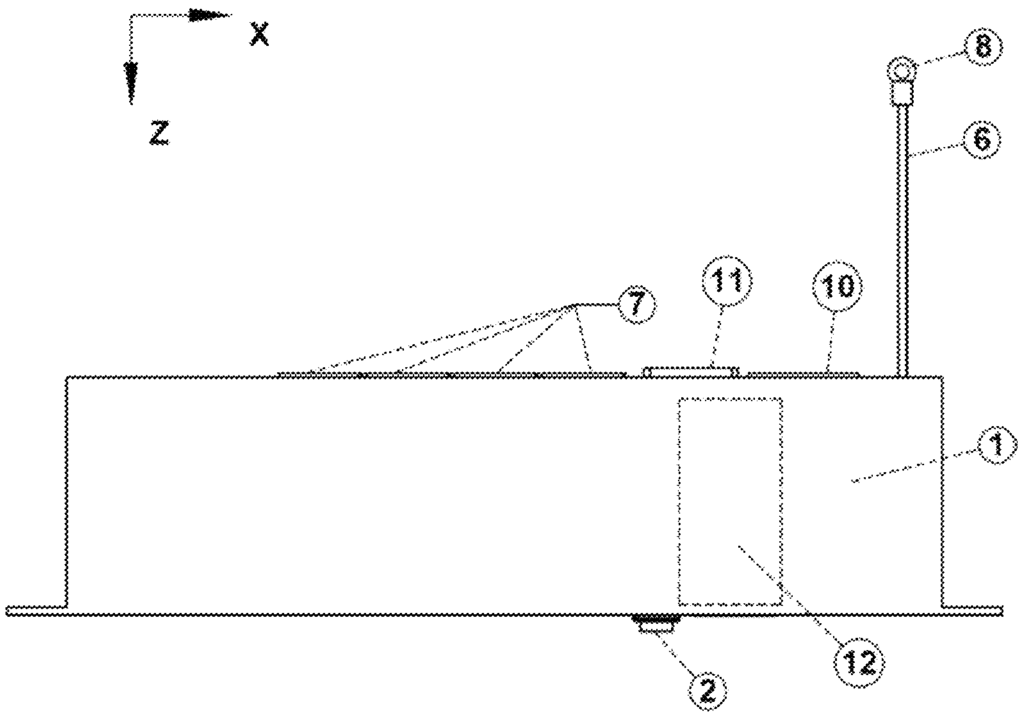

FIG. 7—Top view of PEM shown of FIG. 5.

FIG. elements are labeled as follows:

10—Power Outlet for Remote Module, which could have a disconnect switch (toggle, push-button, etc.), which could be used to disconnect the incoming power to the Main Device.

Remaining elements are labeled same as on previous FIG.s.

Figure 8:
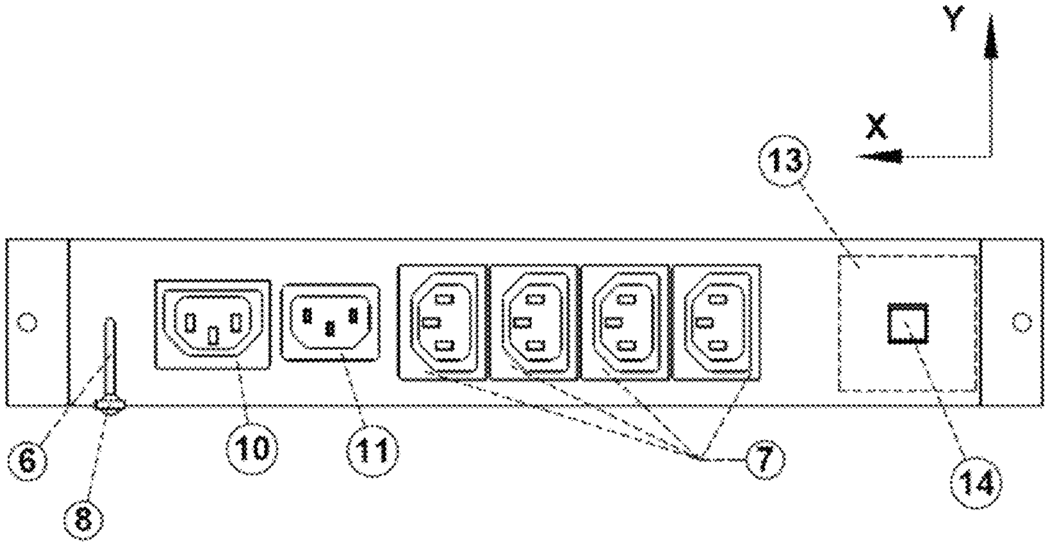

FIG. 8—View from power distribution side of PEM shown of FIG. 5. Elements are labeled same as on previous FIG.s.

Figure 9:
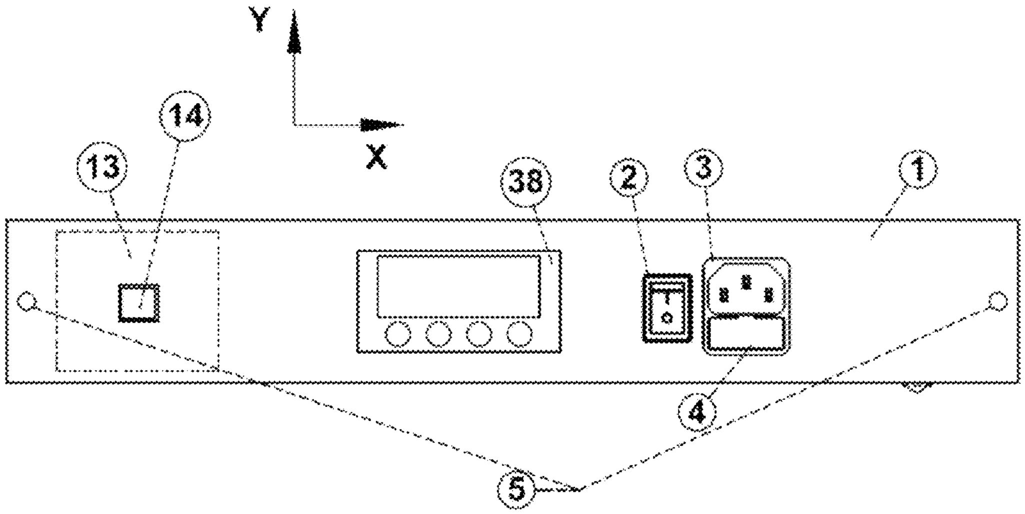

FIG. 9—View from power distribution side of PEM with: local power disconnect component—switch (2); optional power conditioning component—EMC filter, part of (3); over-current protection component—fuse (4); dual power Outlet section switched ON/OFF locally (not visible here); section consisting of power Outlet and Inlet—for interface to a Remote Module (not visible here); dual power distribution Outlet section switched ON/OFF locally or remotely (not visible here); interface for wired LAN (14).

FIG. elements are labeled as follows:

38—Local Controller, which could perform power monitoring, diagnostics and control within the Main Device, communicate, via Module Interface and/or Networking, and exchange data and controls with other Controllers within or outside the Main Device.

Remaining elements are labeled same as on previous FIG.s.

Figure 10:
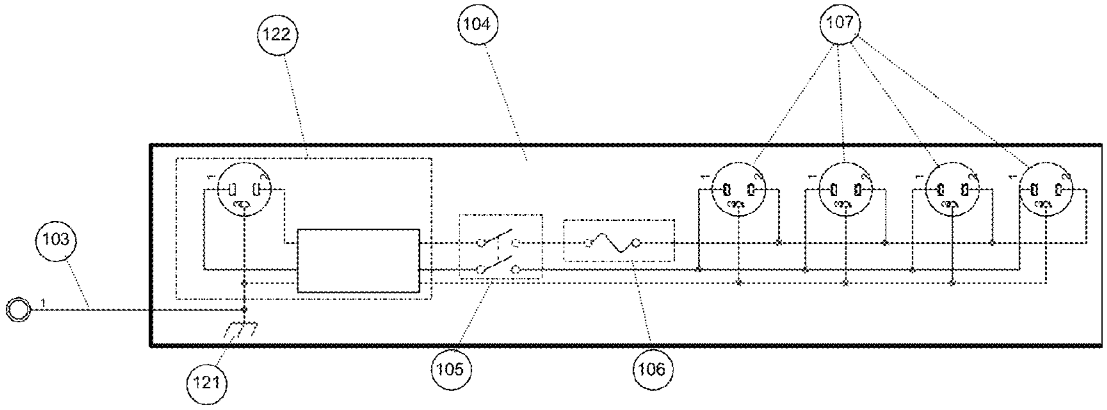

FIG. 10—Wiring diagram of PEM illustrated on FIG. 9.

FIG. elements are labeled as follows:

103—Earth ground wire

104—Power Entry Module

105—Dual-pole incoming power Local Switch

106—Fuse holder with fuse as Local Protection

107—Power distribution Outlets

121—Earth ground electrical connection

122—Local Conditioning component with integrated Entry Plug

FIG. 11 through FIG. 18 (4 pages)—illustrates various packaging configurations or Remote Module. The location of various components within Remote Module could vary to provide the most efficient and convenient access to the operator, as well as interfaces to other Modules or Devices.

Figure 11:
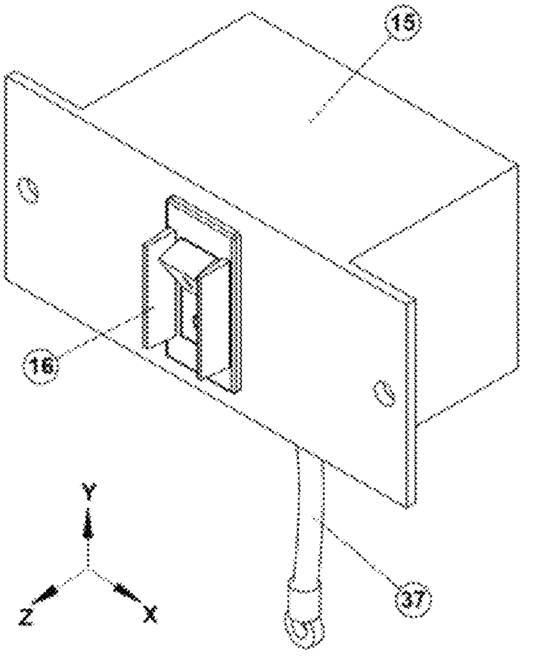

FIG. 11—3-D view of a Remote Module (15) with Remote Switch (16), and an Earth ground wire (37)

Figure 12:
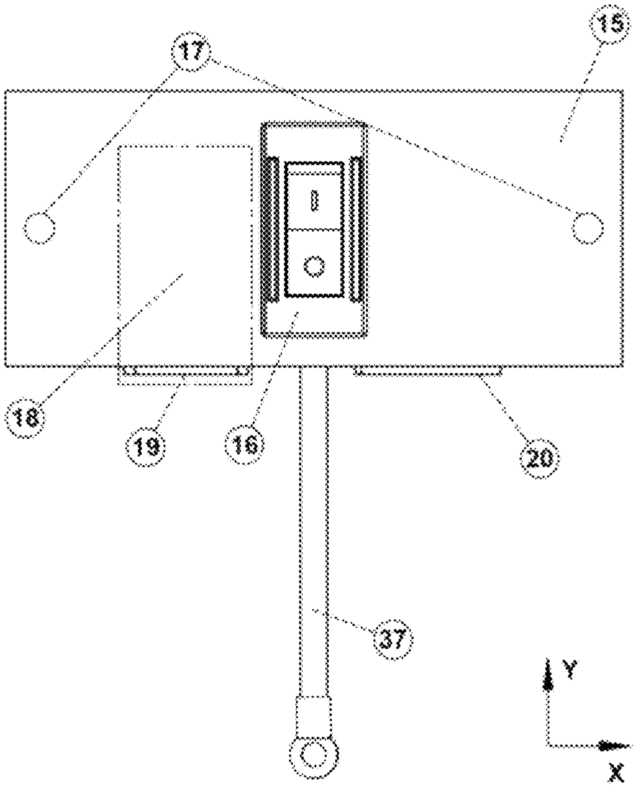

FIG. 12—front view of a Remote Module shown on FIG. 11.

FIG. elements are labeled as follows:

17—Mounting holes for Remote Module

18—Remote Conditioning component with integrated Remote Plug (19)

20—Remote Outlet, which could be controller by Remote Switch (16)

37—Remote Module Earth ground wire

Figure 13:
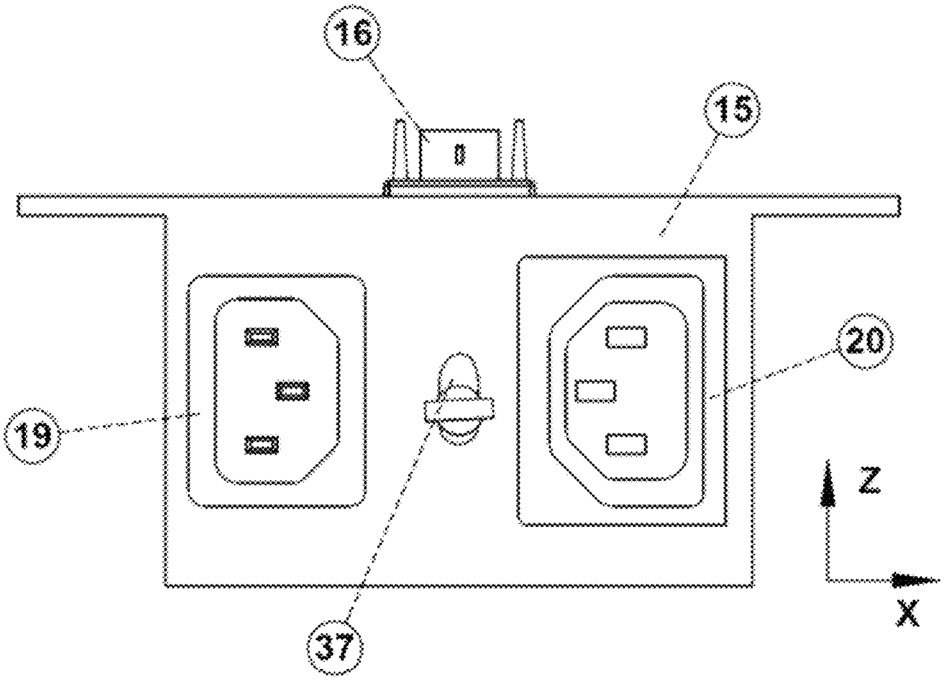

FIG. 13—bottom view of a Remote Module shown on FIG. 11. Elements are labeled same as on previous FIG.s.

Figure 14:
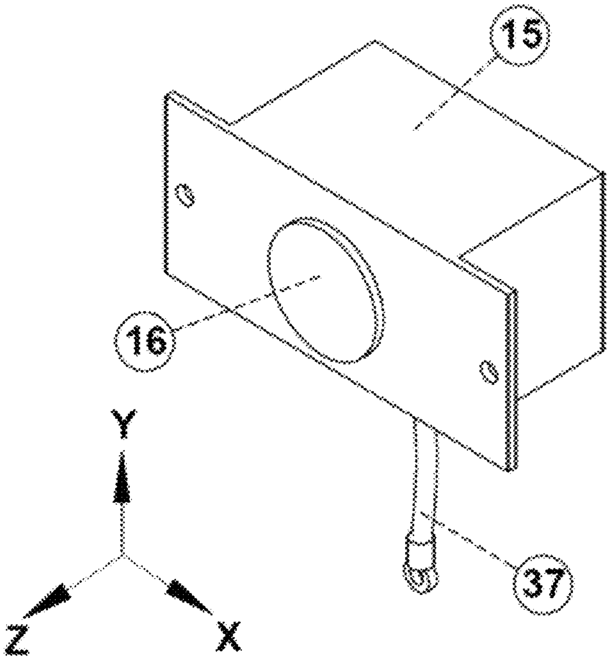

FIG. 14—3-D view of a Remote Module (15) with Remote Switch (16) selected as an emergency push-pull button type. Remaining elements are labeled same as on previous FIG.s.

Figure 15:
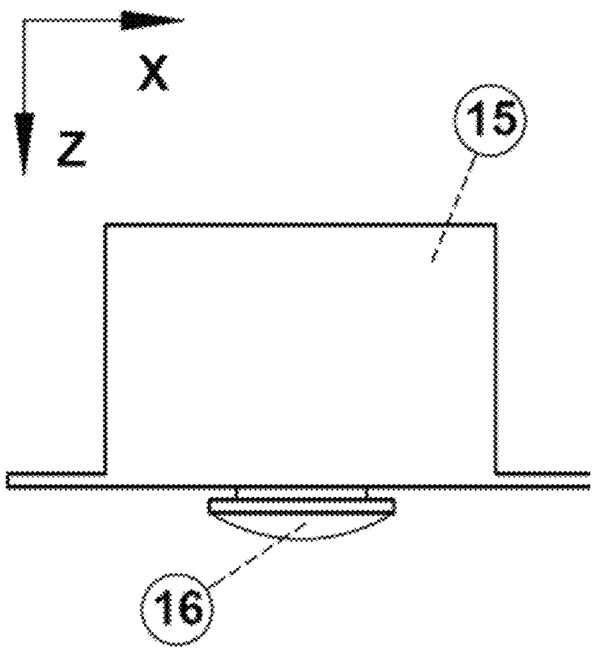

FIG. 15—top view of a Remote Module (15) shown on FIG. 14.

Figure 16:
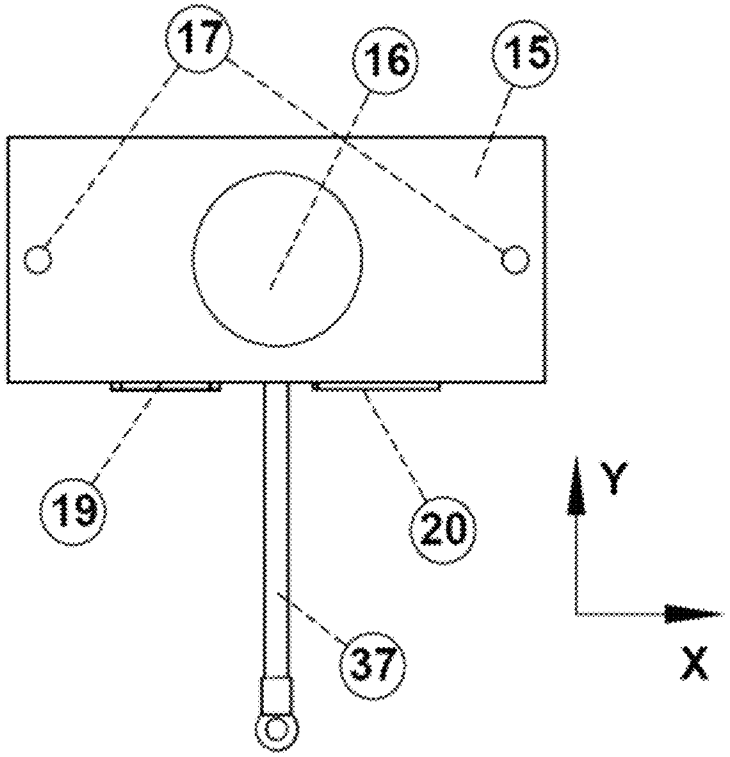

FIG. 16—operator view of a Remote Module (15) shown on FIG. 14.

Figure 17:
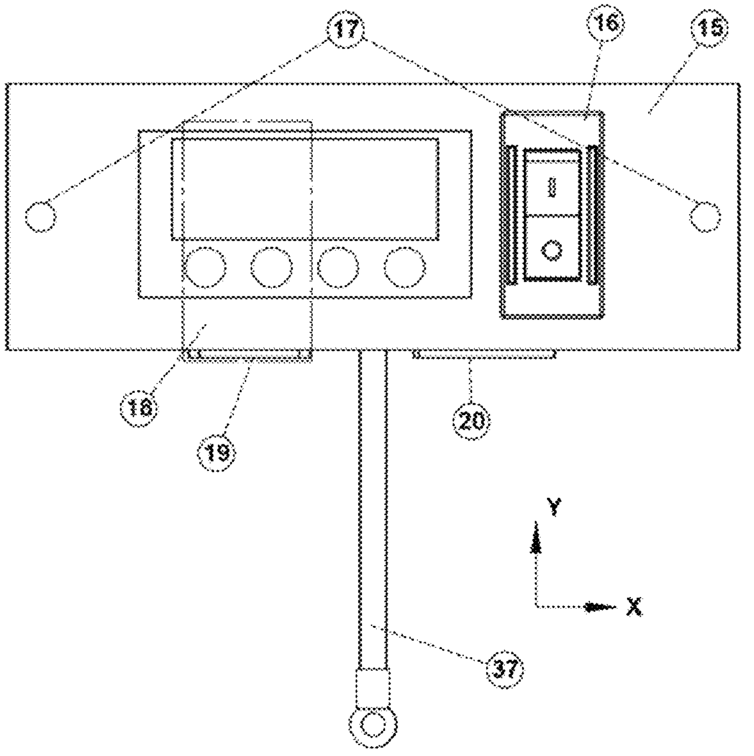

FIG. 17—operator view of a Remote Module (15) shown with Remote Switch (16), Remote Conditioning (18) with integrated Power Entry (19).

Remaining elements are labeled as follows:

17—Mounting holes for Remote Module (15)

20—Power Outlet of the Remote Module (15)

37—Earth ground wire of the Remote Module (15)

Figure 18:
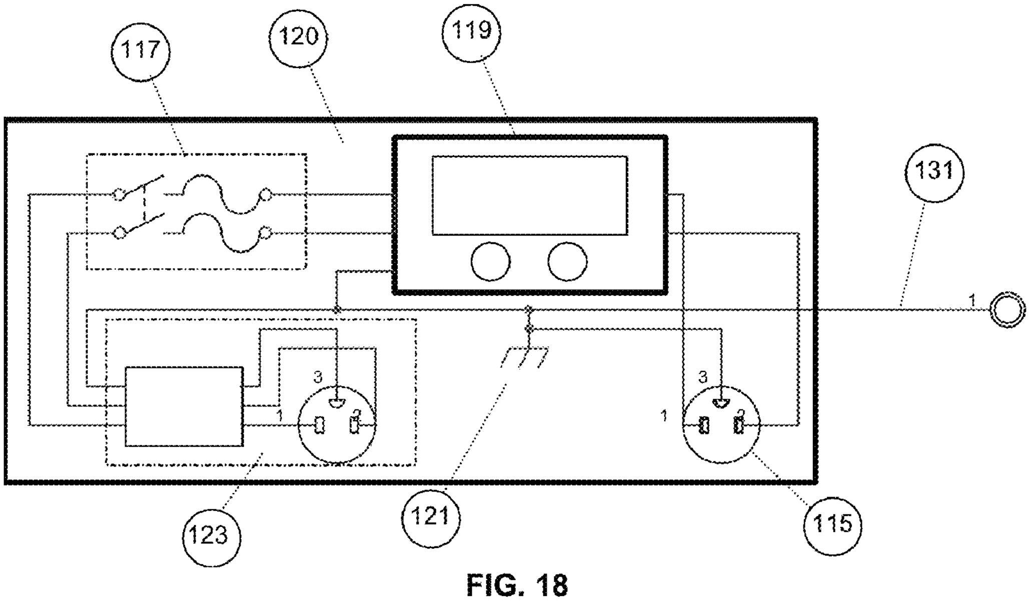

FIG. 18—Wiring diagram of the Remote Module illustrated on FIG. 17.

FIG. elements are labeled as follows:

115—Outlet of Remote Module (120)

117—Remote Switch (dual-pole) and Remote Protection components of the Remote Module

119—Remote Controller, which could perform:

a) Power monitoring/diagnostics of incoming power via Remote Inlet/Conditioning component (123)

b) Power monitoring/diagnostics of power provided to Devices and/or Modules connected via Outlet (115)

c) Exchange of data and controls with other Controllers within and outside the Main Device via power line networking

121—Earth ground connection within the Remote Module

131—Remote Earth ground wire with round ring terminal

FIG. 19 through FIG. 23(5 pages)—3 illustrates various configurations of MPD&CS, which could be assembled within minutes, utilizing proposed standard off-the-shelf Modules and components. In illustrated examples, the design of the Main Device and layout of Secondary Devices could be dictated by specifications for a given application, while design of power distribution to and within the Main Device could be such as to take advantage of off-the-shelf available Modules and components. As result, manufacturing costs of such Devices could be significantly lower, with improvements in reliability and serviceability. As required, the entire system could be designed based on Plug-n-Power, Plug-n-Safety, Power-Proof principals, which are defined and described in this application.

Figure 19:
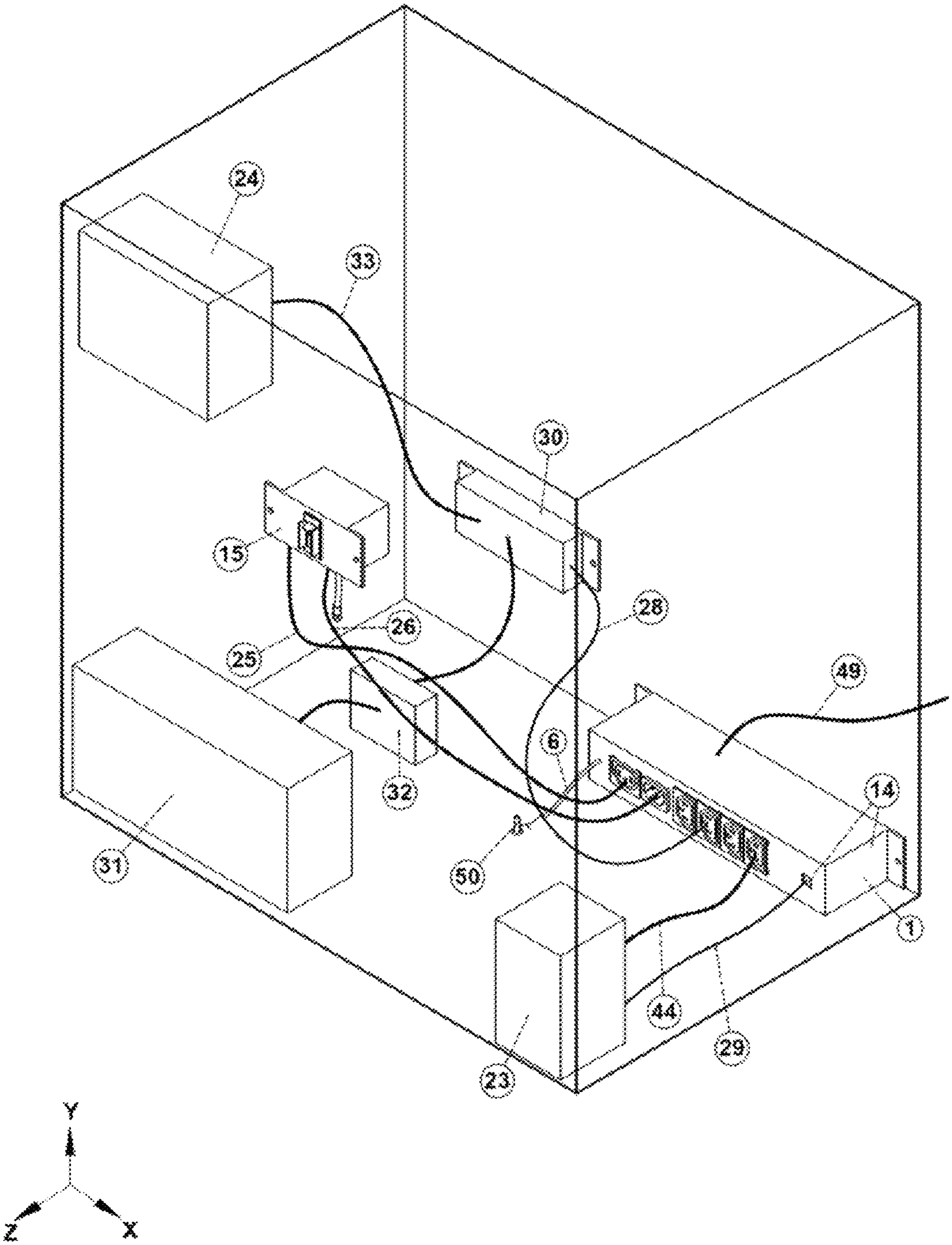

FIG. 19—3-D view of MPD&CS for Main Device (22) with: Secondary Devices:

Computer (23), Touch-screen LCD (24), Printer (31) which could have a dedicated power conversion component (32); Remote Module (15), which could house Switch and Protection components; Standard power strip (30), which could be used for convenient power distribution in between PEM (1)-Remote Module (15) and Secondary Devices (21, 31). In this configuration, the main power disconnect to the Devices could be accomplished: by pulling the incoming power cord (51) out of PEM (1), or by turning OFF power to all power outlets via Remote Switch component of Remote Module (15)

Remaining FIG. elements are labeled as follows:

6—Earth ground wire from PEM (1), which could be connected to the chassis of the Main Device via dedicated Earth ground stud (50), which could be labeled per respective agency regulations

14—PEM (1) housing of LAN interface, which could include LAN conditioning component

25—Power cable connecting Remote Module (15) Inlet to dedicated PEM (1) non-switched Remote Outlet

29—Cable connecting Computer (23) to LAN

27—Power cable connecting Computer (23) to one of PEM (1) Remotely Switched and Protected Outlet

28—Power cable connecting Standard power strip (30) to one of PEM (1) Remotely Switched and Protected Outlet

33—Power cable connecting Touch-screen LCD (24) to one of Remotely Switched and Protected Outlet of the Standard power strip (30)

49—Cable providing incoming power to the Main Device via PEM (1)

Figure 20:
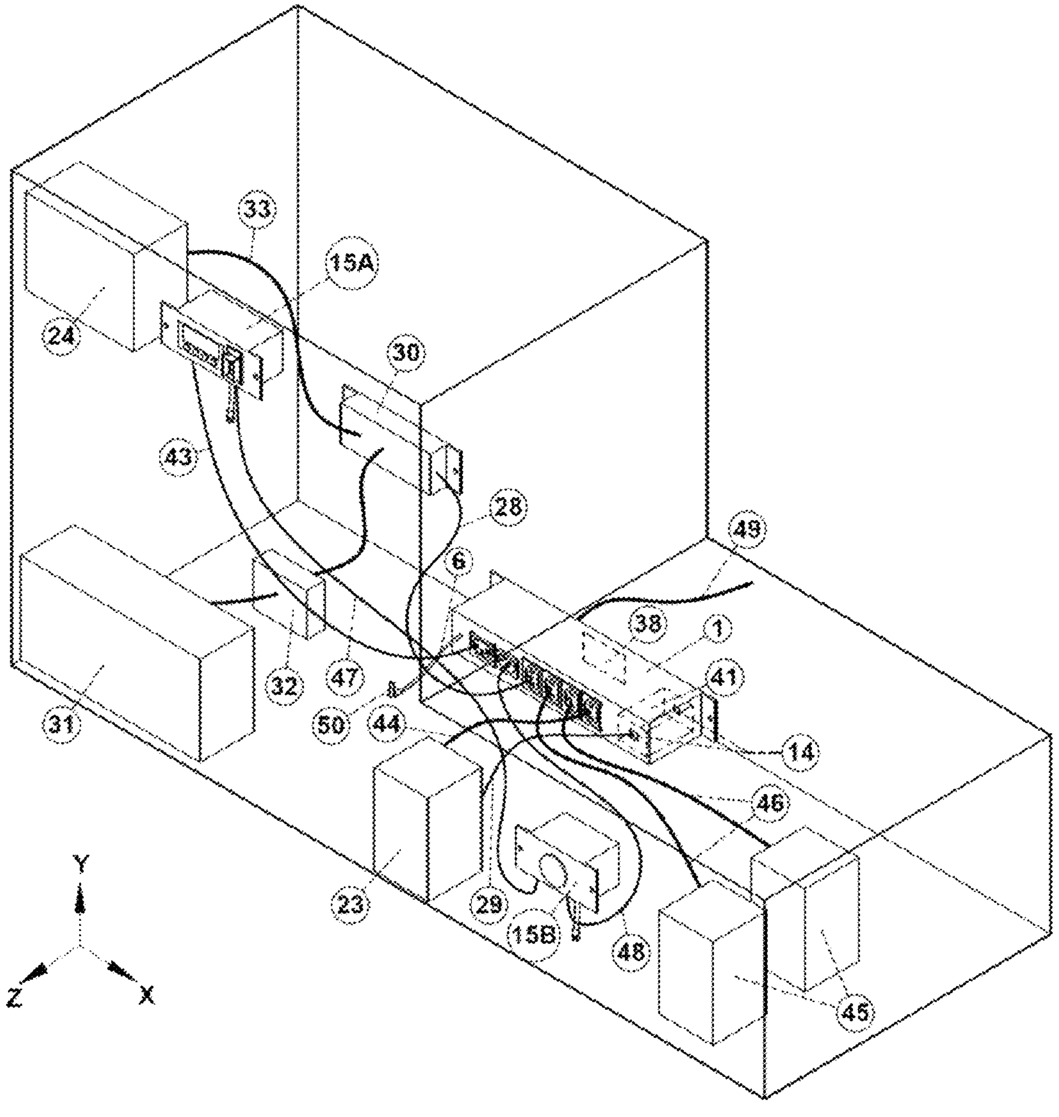

50—Earth ground connection from PEM (1), which could be connected to chassis of the Main Device FIG. 20—3-D view of MPD&CS with centralized and remote power monitoring, diagnostics and control for a Main Device (22) with Secondary Devices: Computer (23), Touch-screen LCD (24), Printer (31), two Conveyors with respective controllers (45). In this configuration, the main power disconnect to the Devices could be accomplished: by pulling the incoming power cord (51) out of PEM (1), or by turning OFF power to all power outlets via Remote Switch component of Remote Module (15A). In addition, power to conveyor motor controllers (45) and Printer (31) could be disconnected via push-pull disconnect switch component of Remote Module (15B), which could be used as a local convenient power disconnect in events of emergency, etc. The illustrated example of an MPD&CS is fairly sophisticated, and includes a number of powerful features, yet all power distribution components within the system could be all off-the-shelf standard cost effective components, and the assembly of the entire system could be accomplished in record time, significantly lower compared to what could be required using existing methods.

Remaining FIG. elements are labeled as on FIG. 19, with additional elements as follows:

38—Local Controller, which could perform power monitoring, diagnostics and control within the Main Device (22), communicate, via Module Interface and/or Networking, and exchange data and controls with other Controllers within the Main Device (22), which could include Remote Controller (42) located inside Remote Module (15A), or outside the Main Device.

41—LAN conditioning component of the PEM (1)

42—Remote Controller component located inside the Remote Module (15A), which could perform power monitoring, diagnostics and control of Secondary Devices connected to Remote Module (15B), and could communicate, via Module Interface and/or Networking, and exchange data and controls with other Controllers within or outside the Main Device (22).

43—Power cable between the PEM (1) and Remote Module (15A), which could be used as a communication link component of Module Interfacing and/or Networking.

44—Power cable between the PEM (1) and Computer (23), which could be used as a communication link component of Module Interfacing and/or Networking

45—Conveyor motor controller/driver, one for each conveyor

46—Power cable between the PEM (1) and motor controller/drivers (45), which could be used as a communication link component of Module Interfacing and/or Networking

47—Power cable between the Remote Module (15A) and the Remote Module (15B), which could be used as a communication link component of Module Interfacing and/or Networking

Figure 21:
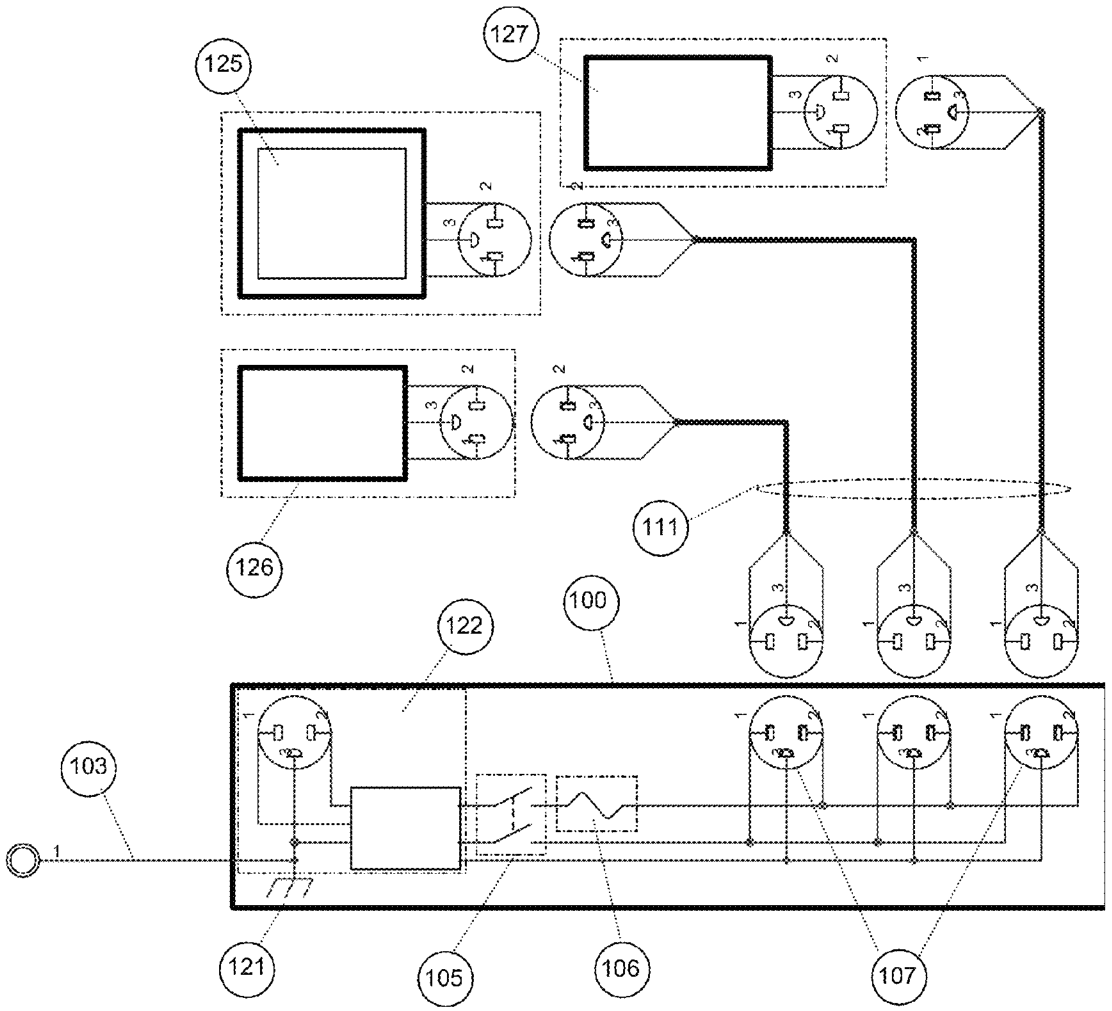

48—Power cable between the Remote Module (15B) and the PEM (1), which could be used as a communication link component of Module Interfacing and/or Networking FIG. 21—Illustrates an example of a wiring diagram of MPD&CS for a relatively simple application: there are 3 Secondary Devices (125, 126, 127), which are connected to one PEM (100) of a Main Device via power cables (111). As needed, shown Secondary Devices could also communicate with each other via power cables (111), as Module Networking or Device Networking via available power lines, and as needed, any of them, could also communicate with computers or Modules outside the Main Device, that could be connected to PEM (100) via incoming power cable (not shown) connected to (122)

FIG. elements are labeled as follows:

103—Earth ground wire of PEM, which could be connected to Main Device enclosure's dedicated Earth ground stud

105—Local Switch, shown as single throw, dual-pole type, which could serve as power disconnect for the Main Device and Secondary Devices within it

106—Local Protection, shown as a fuse

107—Local Outlets, 3 shown for simplicity

100—PEM, shown with: Local Protection and integrated Power Inlet (122), dual pole Local Switch (105), single phase Local Protection (106), and 3 Outlets (107)

111—Power cables, each consisting of 3 conductors properly rated and approved for this application. As needed, these cables could be shielded, and could serve for Module Networking

121—Earth ground connection within PEM

122—Local Conditioning component with integrated Entry Plug

125—Touch screen LCD, which could be connected to one of the Outlets of PEM

126—Computer, which could be connected to one of the Outlets of PEM

127—Printer, which could be connected to one of the Outlets of PEM

Figure 22:
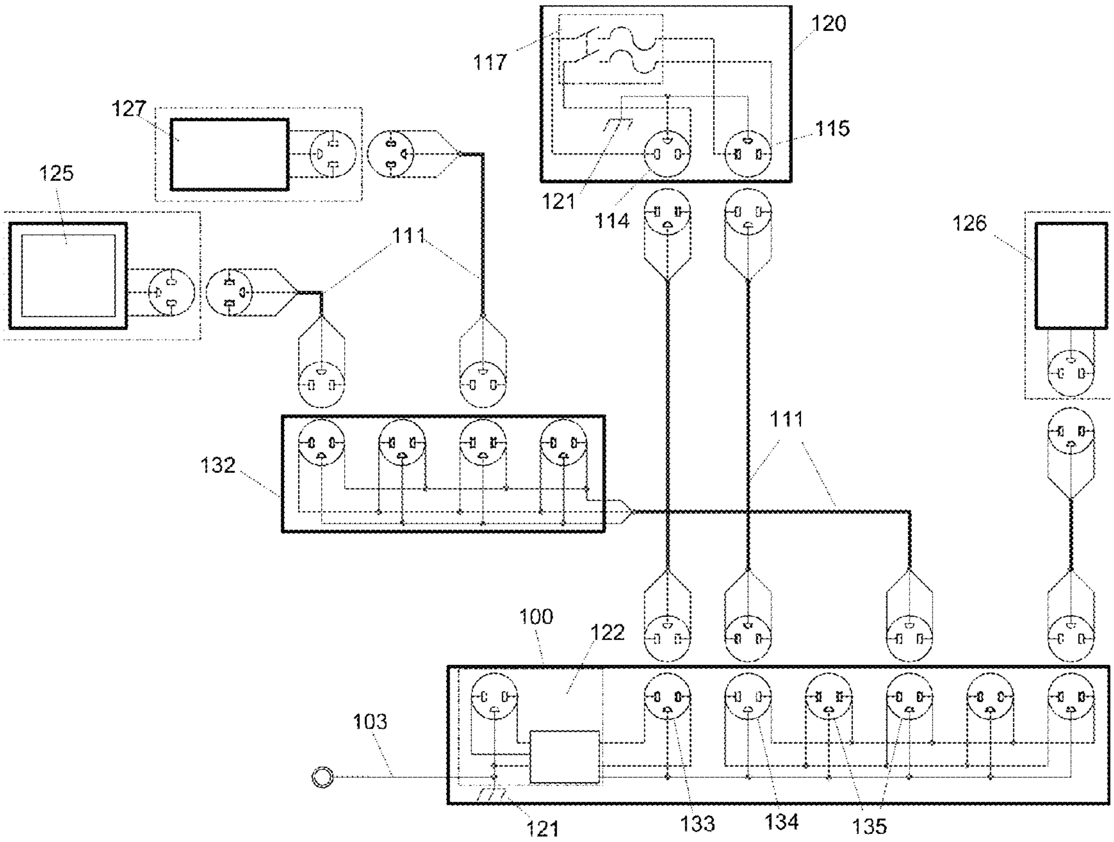

FIG. 22—Wiring diagram of MPD&CS, shown of FIG. 19. There are 3 Secondary Devices (125, 126, 127), which are connected as follows: Computer (126) to one of available Outlets on PEM (100), Touch screen LCD (125) and Printer (127) are connected to standard power strip (132), which in turn is connected to the other available Outlet on PEM (100). In this example, all available Outlets (4 shown) on PEM are Remotely Switched and Remotely Protected via Remote Module (120).

The remaining FIG. elements are labeled as follows:

103—Earth ground wire of PEM, which could be connected to Main Device enclosure's dedicated Earth ground stud

133—PEM Local Outlet, which could be connected to Remote Inlet (114) of Remote Module (120)

134—PEM Local Inlet, which could be connected to Remote Outlet (115) of Remote Module (120), and which could have Remote Switching and Remote Protection

135—PEM Local Outlets, which could be controlled and protected by Remote Module (120)

Figure 23:
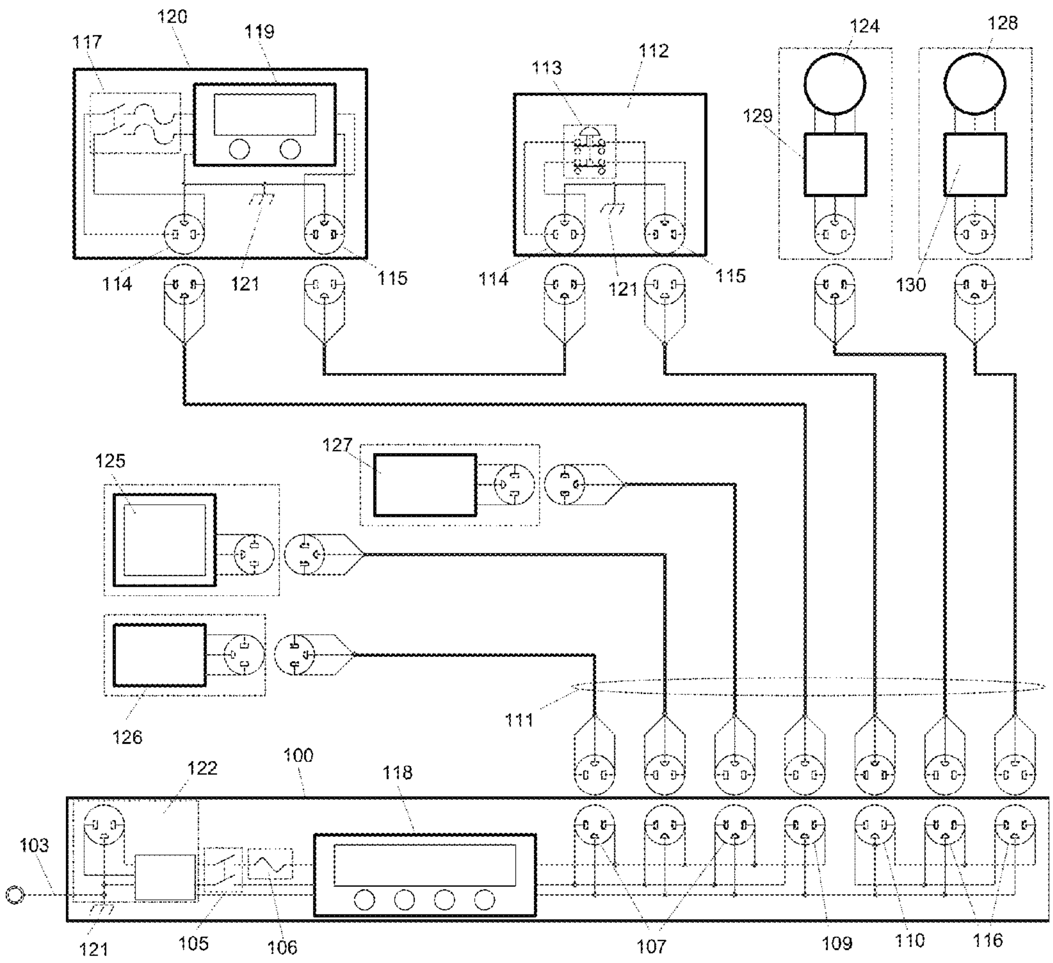

FIG. 23—Wiring diagram of MPD&CS, shown of FIG. 20. In this example, there are 2 Remote Modules (112, 120) and 5 Secondary Devices (125, 126, 127, 129, 130), which are connected to one PEM (100) of a Main Device via power cables (111). As shown, both the PEM (100) and Remote Module (120) could have Local and Remote Controllers (118, 119) respectively. Either of these Controllers, as needed, could have non-volatile memory, battery back-up and other features, and could be wired in a such a matter (i.e. parallel to power lines, etc.—not shown for simplicity), that could allow it to perform other functions, such as: recording data preceding power failures related to respectively connected Secondary Devices, power outages, over-current conditions, etc. The Local Controller (118) could monitor and/or control incoming power to the Main Device, and all Devices and/or Modules connected to PEM (100), while Remote Controller (119) could monitor and/control Remote Modules and/or Secondary Devices connected to the Outlet (115) of Remote Module (120).

All connected Modules and/or Devices could communicate with each other, and/or with remote computer via Module and/or Device Networking over installed power lines.

The layout shown, could be used for implementing the following features:

a) Power monitoring (quality, consumption, etc.) of the entire Main Device via installed Local Controller (118)
b) Power monitoring (quality, consumption, etc.) and power control of the selected Secondary Devices (129, 130) via installed Remote Controller (119)
c) On-site emergency power disconnect to Secondary Devices (124, 128) via Remote Module (112), which could be conveniently located for prompt operator action, as needed
d) Over-current Protection Local (106) and Remote (117), which could also have over-voltage protection installed, as needed
e) Both Controllers, Local (118) and Remote (119) via Device and/or Module Networking could exchange required data and controls between themselves and remote computer(s) to ensure safe and reliable operation of each Device With all the powerful features, the illustrated MPD&CS could be assembled and running in a matter of minutes, utilizing industry standard Modules and components, which could be designed and produced based on methods described in this application.

Remaining elements are labeled as follows:

109—Locally switched Outlet, which could be designated for connecting Remote Module (120). For simplicity of identification, this Outlet could be mounted differently from other Outlets (offset vertically, rotated 90°, etc.)—an example shown on FIG. 21

110—Remotely switched Inlet, which could be designated to be controlled locally and via Remote Module (120). For simplicity of identification, this Inlet could be mounted together with the respective Outlet (109)—an example shown on FIG. 21

116—PEM Outlets, which could be switched locally via Switch (105), or remotely, via Remote Modules (120) or (112). These PEM Outlets, could have Local Protection via (106) and Remote Protection via (117)

FIG. 24 through FIG. 27 (3 pages)—illustrates wiring diagrams of various power Modules. As noted below, some of the Modules could be used for 115/230 VAC power distribution. As required, all Modules could be designed based on Plug-n-Power, Plug-n-Safety, Power-Proof principals, which are defined and described in this application.

Figure 24:
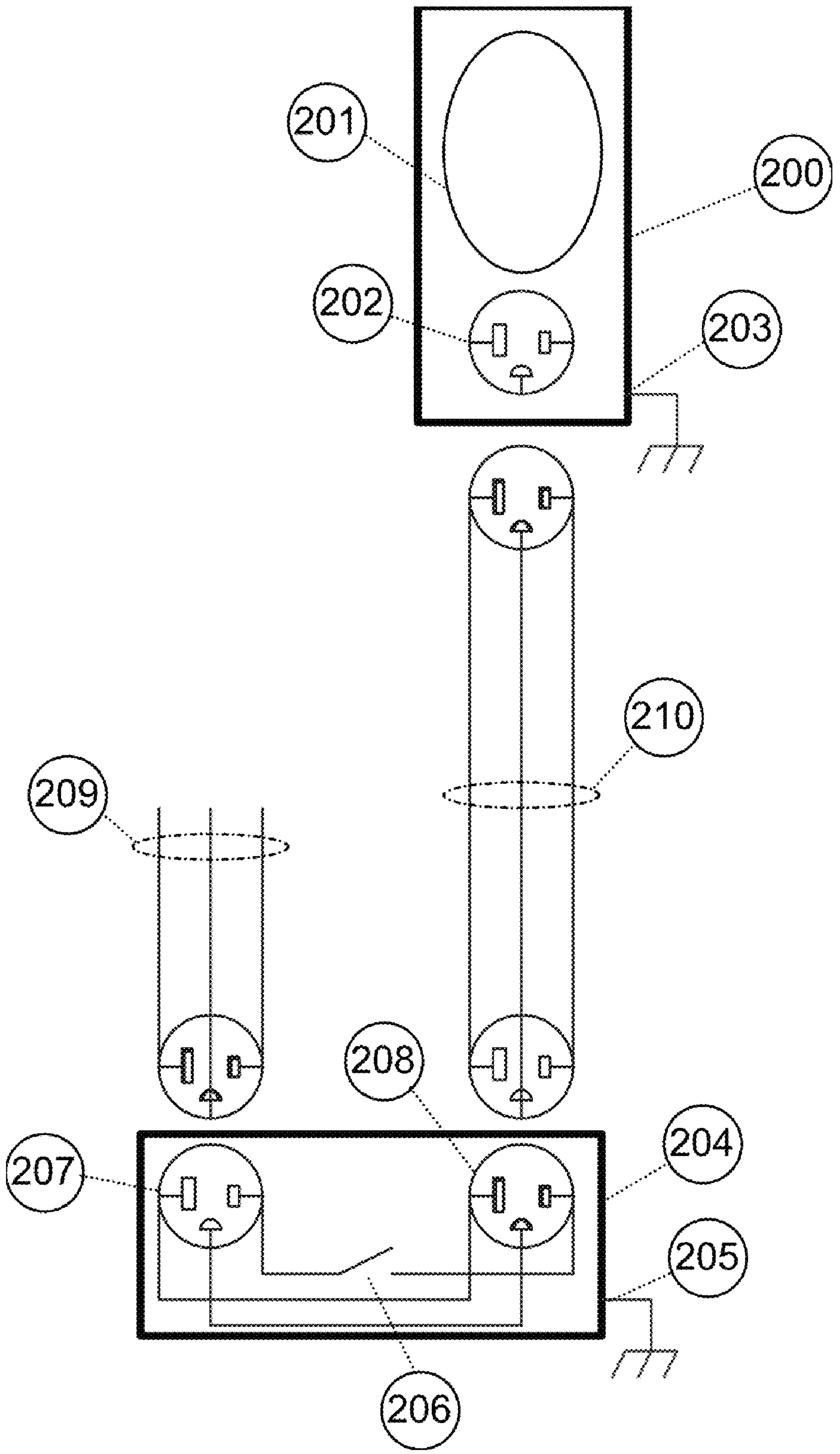

FIG. 24—Illustrates wiring diagram of a 115 VAC Switch Module (204) to a 115 VAC lamp fixture (200) FIG. elements are labeled as follows:

200—115 VAC lamp fixture, which could have 115 VAC power inlet plug NEMA 5-15P (202)

201—Lamp bulb inside the lamp fixture (200)

203—Earth ground wire for grounding the enclosure of the lamp fixture (200)

204—115 VAC fully enclosed Switch Module, which as shown, includes following components: power inlet NEMA 5-15P (207); switch (206); power outlet NEMA 5-15R (208); Earth ground wire (205), which could be used for connecting metal enclosure (when used) to Earth grounding at the installation site, as required by national and/or local safety code.

206—115 VAC switch, which could be wired inside enclosure of (204), as shown

209—section of the 115 VAC power incoming cable, with mating connector NEMA 5-15R to be connected to (207)

210—115 VAC power cable for providing 115 VAC switched power from outlet (208) of Switch Module (204) to power inlet (202) of the 115 VAC lamp fixture (200)

Figure 25:
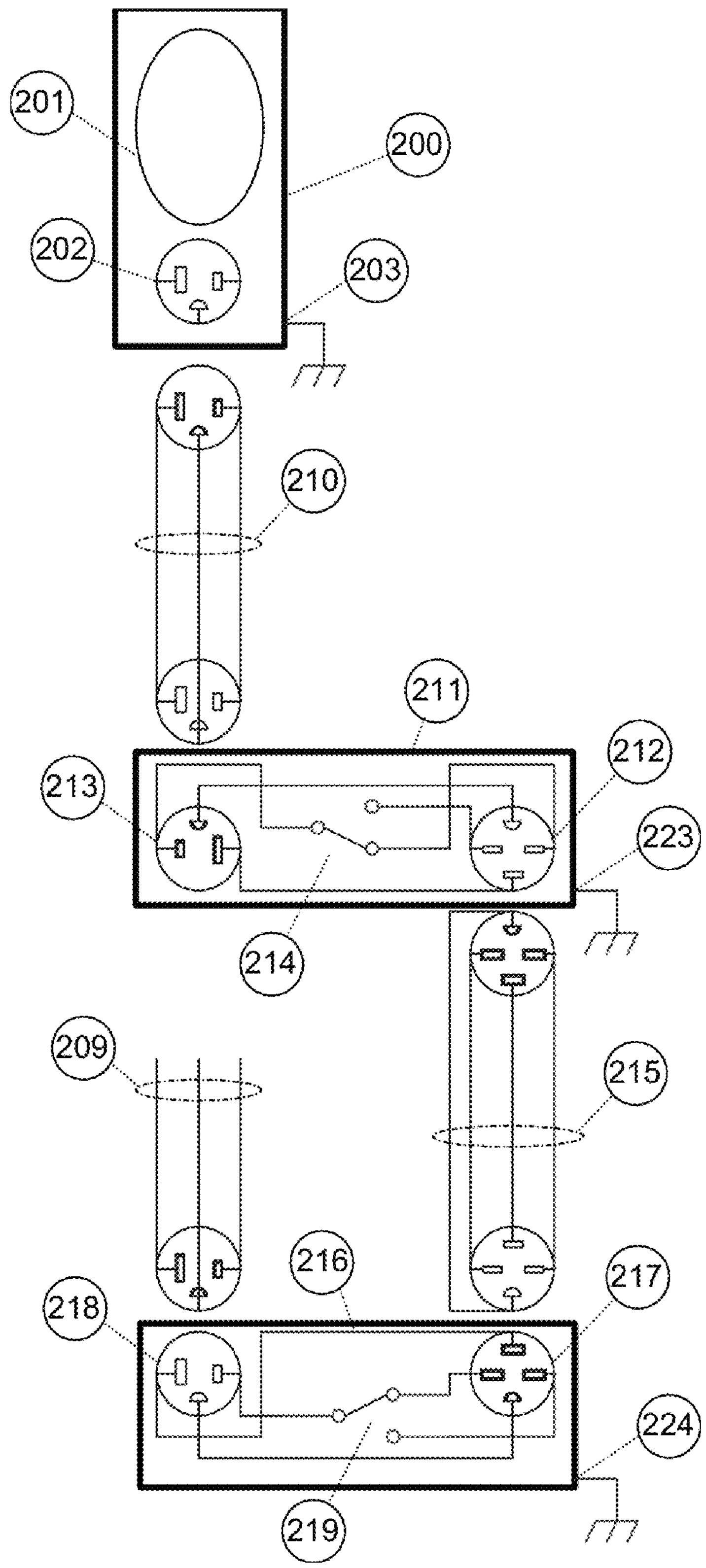

FIG. 25—Illustrates wiring diagram of a 115 VAC 2-way Switching of a 115 VAC lamp fixture (200) FIG. elements are labeled as follows:

211—115 VAC Switch Module #2, which as shown, includes following components: power inlet NEMA 14-15P (212) for connecting to power cable (215) to receive incoming switched 115 VAC power from Switch Module #1 (216); switch (214); power outlet NEMA 5-15R (213); Earth ground wire (223), which could be used for connecting metal enclosure (when used) to Earth grounding at the installation site, as required by national and/or local safety code.

216—115 VAC Switch Module #1, which as shown, includes following components: power inlet NEMA 5-15P (218) for connecting to power cable (209) to receive incoming 115 VAC power, which could come directly from a Panel Module (not shown), switch (219); power outlet NEMA 14-15R (217); Earth ground wire (224), which could be used for connecting metal enclosure (when used) to Earth grounding at the installation site, as required by national and/or local safety code.

Remaining elements are labeled same as on FIG. 24.

Figure 26:
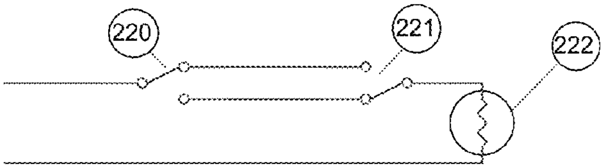

FIG. 26—Illustrates wiring schematic of 115 VAC 2-way Switching shown on FIG. 25.

These type of wiring schematics could be useful in designing of custom switching schemes, to verify the proper logic, and most convenient interface, with an objective to use standardized cabling in-between various control Modules and the respective load.

FIG. elements are labeled as follows:

220—schematic representation of 115 VAC Switch Module #1, shown on FIG. 25 as (216)

221—schematic representation of 115 VAC Switch Module #2, shown on FIG. 25 as (211)

220—schematic representation of 115 VAC lamp fixture, shown on FIG. 25 as (200)

Figure 27:
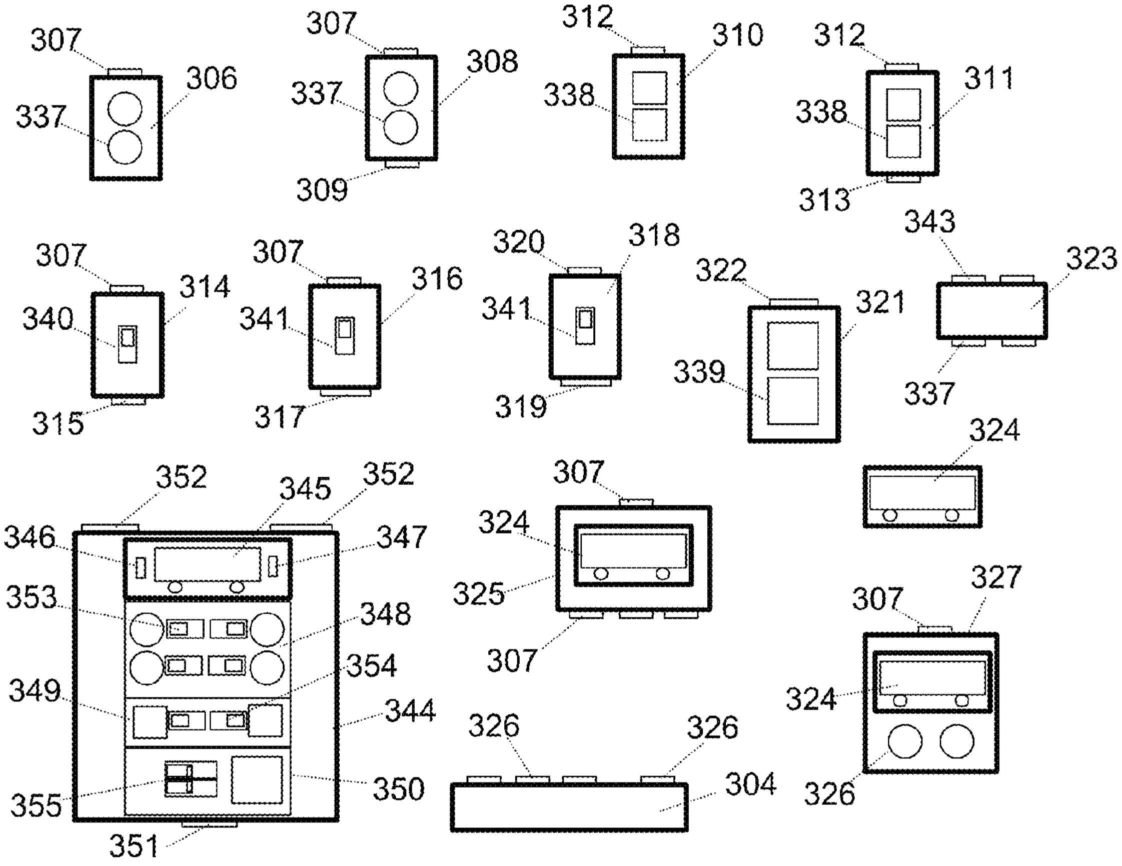

FIG. 27—Illustrates graphical symbols of a variety of Modules, which could be used in designing required MPD&CS. These graphical symbols, as illustrated in this example, could be used for creating wiring diagrams and other documentation, which could assist in designing and installation.

For simplicity, these graphical representations do not show:

a) The Earth ground wire, which could be part of each Module, as required by national and/or local safety code b) Devices and components shielding options c) Devices and components environmentally sealed packaging options.

FIG. elements are labeled as follows:

304—115 VAC 15 A power Distribution Module. The incoming power connection could be via NEMA 5-15P (307), and power connection for each load (three shown) could be via NEMA 5-15R (326).

306—dual 115 VAC/15 A power Outlet Module with power plug NEMA 5-15P (307) for connecting to incoming 115 VAC power supply cable

308—dual 115 VAC/15 A Feed-through power Outlet Module with power plug NEMA 5-15P (307) for connecting to incoming 115 VAC/15 A power supply cable, and power outlet NEMA 5-15R (309), which could be used for passing 115 VAC power to the next Module, as needed.

310—dual 115 VAC/20 A power Outlet Module with power plug NEMA 5-20P (312) for connecting to incoming 115 VAC/20 A power supply cable

311—dual 115 VAC/20 A Feed-through power Outlet Module with power plug NEMA 5-20P (312) for connecting to incoming 115 VAC/20 A power supply cable, and power outlet NEMA 5-20R (313), which could be used for passing 115 VAC power to the next Module, as needed.

314—115 VAC/15 A power Switch Module with following components: power plug NEMA 5-15P (307) for connecting to incoming 115 VAC/15 A power supply cable; 115 VAC/15 A switch; power outlet NEMA 5-15R (315) for providing switched 115 VAC/15 A power to connected load.

316—115 VAC/15 A power Switch Module, which could be used for 2-way switching installation, and which could contain the following components: power plug NEMA 5-15P (307) for connecting to incoming 115 VAC/15 A power supply cable; 115 VAC/15 A 2-way switch; power outlet NEMA 14-15R (317) for providing switched 115 VAC/15 A power to the other Switch Module (not shown) for implementation of 2-way switching.

318—115 VAC/20 A power Switch Module with following components: power plug NEMA 5-20P (320) for connecting to incoming 115 VAC/20 A power supply cable; 115 VAC/20 A switch; power outlet NEMA 5-20R (319) for providing switched 115 VAC/20 A power to connected load.

321—dual 230 VAC/20 A power Outlet Module with power plug NEMA 6-20P (322) for connecting to incoming 230 VAC/20 A power supply cable. 230 VAC/20 A outlets could be NEMA 6-20R, or other standard configuration, as required.

323—Interface Module, which could be based on providing a standard function, or custom function as needed. The number and type of inlet power plugs, as well as number and type of outlet power receptacles could be selected per respective specifications. The symbol shown, is a general symbol. For any specific application, Interface Module could be represented by a more specific symbol, which could better reflect interface capabilities of an Interface Module.

324—Power Monitoring Module, which could be designed to perform specific functions, as needed

325—3-load 115 VAC 15 A total Power Distribution Module with Power Monitoring Module. The incoming power connection could be via NEMA 5-15P (307), and power connection for each load could be via NEMA 5-15R (326). As needed, Power Monitoring Module could be designed to monitor power for each individual load, and/or total power consumed by all three loads. Power Monitor user interface could allow entry of desired limits in regard to: power consumption; power availability to each or all loads as function of real time; remote control access by other Controller within the System; etc.

327—2-load 115 VAC 15 A total Power distribution Module with Power Monitoring Module. The incoming power connection could be via NEMA 5-15P (307), and power connection for each load could be via NEMA 5-15R (326). As needed, Power Monitoring Module could be designed to monitor power for each individual load, and/or total power consumed by both loads. Power Monitor user interface could allow entry of desired limits in regard to: power consumption; power availability to each or all loads as function of real time; remote control access by other Controller within the System; etc.

344—Electrical Panel, which could have four functional sections: Power Distribution section of 115 VAC 15 A (348)—four outlets, which could be NEMA 5-15R, each protected by 115 VAC 15 A circuit-breaker switch (353); Power Distribution section of 115 VAC 20 A (349)—two outlets, which could be NEMA 5-20R, each protected by 115 VAC 20 A circuit-breaker switch (354); Power Distribution section of 230 VAC 15 A (350)—one outlet, which could be NEMA 6-15R, protected by dual 230 VAC 15 A circuit-breaker switch (355);

345—Power Monitoring and Control Module for Electrical Panel (344), which could be designed to support any combination of the following functions: monitor incoming power to Electrical Panel (344); monitor and/or control power consumption by each or all power distribution sections of (344); interface to local or remote Controller via hi-speed serial interface wired or wireless—connection (346); interface to Utility company LAN, as needed, connection (347); Power Monitor user interface could allow entry of desired limits in regard to: power consumption; power availability to each or all sections as function of real time; remote control access by other Controller within the System; etc.

351—opening in the Electrical Panel (344) enclosure for incoming power interface

352—openings in the Electrical Panel (344) enclosure for power distribution cables to exit the Electrical Panel (344) to provide power to respective Modules.

Figure 28:
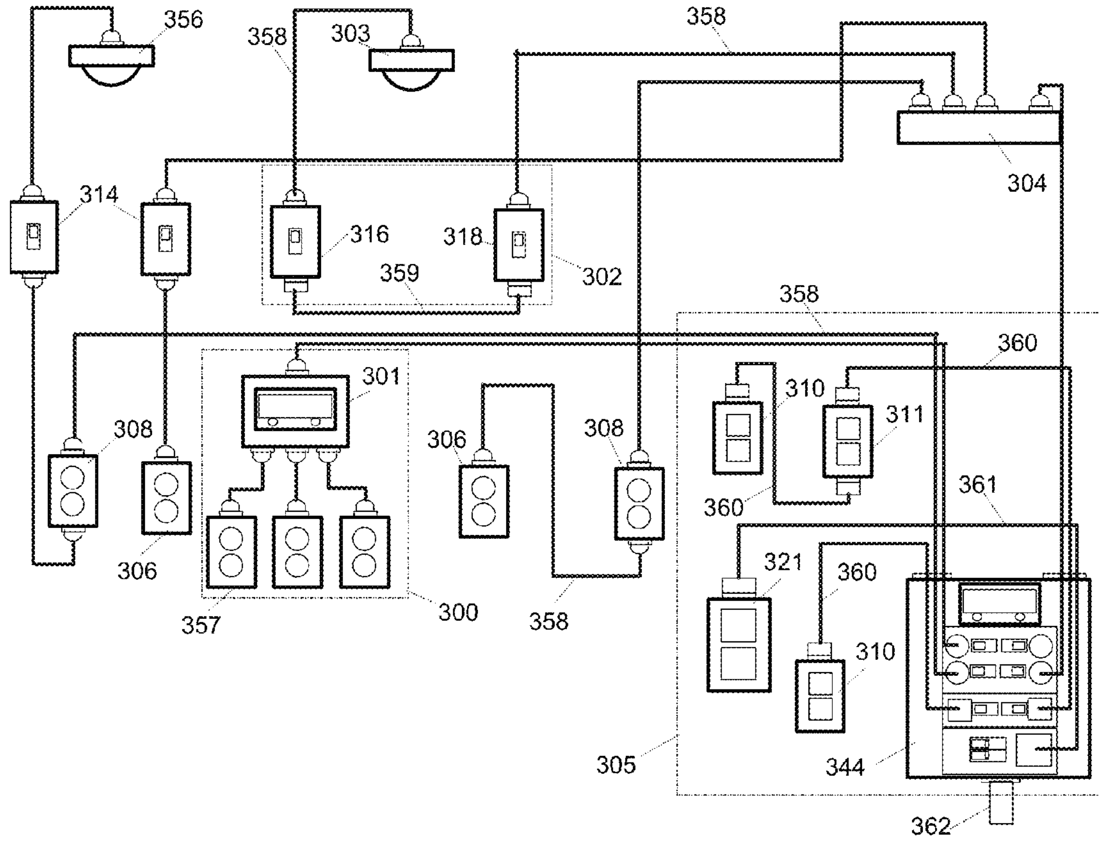

FIG. 28 (1 page)—5 illustrates System Wiring Diagram for applications, which could include residential buildings. The System could provide 115 VAC and 230 VAC power distribution. Similar designs could be accomplished using methods described in this application for commercial and industrial sites. As required, the entire system could be designed based on Plug-n-Power, Plug-n-Safety, Power-Proof principals, which are defined and described in this application. Drawing elements are labeled as follows:

300—section of the System, which could be dedicated to real-time Power Monitoring and control of selected power outlet Modules, as shown 3 dual 115 VAC 15 A Power Outlets (357)

302—section of the System, which could be dedicated to 2-way Switching

303—115 VAC Lamp Fixture, which could be controlled via 2-way Switching Modules (316) and (318)

359—Interface cable between 2-way Switching Modules (316) and (318)

356—115 VAC Lamp Fixture, which could be controlled via single Switch Module (314)

344—main Electrical Power Distribution Panel, which could be used for this application. For simplicity, shown Panel could consist of: 115 VAC 15 A Power Distribution section—4 outlets; 115 VAC 20 A Power Distribution section—2 outlets; 230 VAC 15 A Power Distribution section—1 outlet. All Power Outlet Modules could have over-current protection devices, such as circuit-breaker switch. As needed, a GFIC circuit-breaker, and any other devices required by national and/or local safety agency, could be added. Other components are labeled as on FIG. 27.

FIG. 29 through FIG. 43 (3 pages)—illustrates mechanical packaging of various 115 VAC and 230 VAC Modules and components, which could be used for 115/230 VAC power distribution.

For simplicity, some of the FIG.s may not show:

a) Earth ground wire, which could be installed for each Module, as required by national and/or local safety agency
b) Mechanical mounting components
c) Strain-relief component, which could be used to secure a cable plugged into a Module As shown, all Modules could be fully enclosed inside a metal or plastic enclosure, which is one of important options of the new technology, in providing additional safety, even “behind the wall”. For simplicity, power interface connectors for each Module are shown per respective IEC standards, which could be more convenient than NEMA, since IEC connector are rated 230 VAC. As required, all enclosures, packaging components, etc. could be designed based on Plug-n-Power, Plug-n-Safety, Power-Proof principals, which are defined and described in this application.

Figure 29:
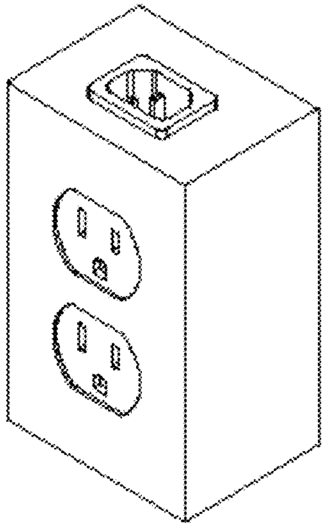

FIG. 29—Illustrates 3-D view of dual 115 VAC/15 A Feed-through power Outlet Module (400) with power plug IEC320 C14 (401) for connecting to incoming 115 VAC/15 A power supply cable, and power outlet IEC320 C13 (406), which could be used for passing 115 VAC power to the next Module, as needed. Both power Outlets (404), as shown, could be NEMA 5-15R.

Figure 30:
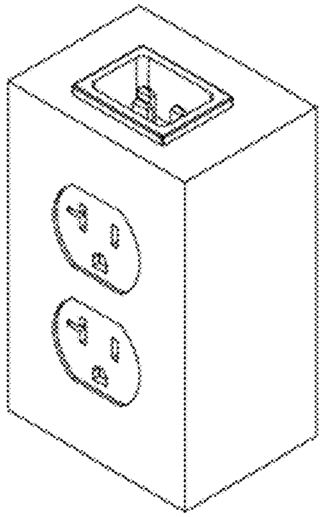

FIG. 30—Illustrates 3-D view of dual 115 VAC/20 A power Outlet Module (402) with power plug IEC C20 (403) for connecting to incoming 115 VAC/20 A power supply cable. Both power Outlets (405), as shown, could be NEMA 5-20R.

Figure 31:
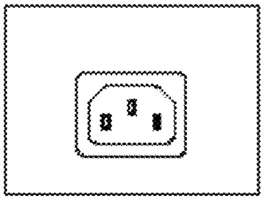

FIG. 31—Illustrates top view of dual 115 VAC/15 A Feed-through power Outlet Module (400) shown on FIG. 29.

Figure 32:
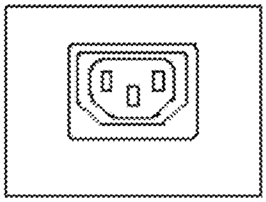

FIG. 32—Illustrates bottom view of dual 115 VAC/15 A Feed-through power Outlet Module (400) shown on FIG. 29.

Figure 33:
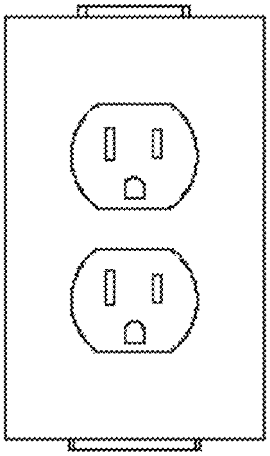

FIG. 33—Illustrates front view of dual 115 VAC/15 A Feed-through power Outlet Module (400) shown on FIG. 29.

Figure 34:
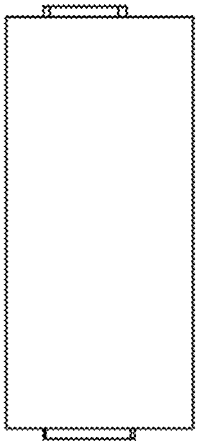

FIG. 34—Illustrates side view of dual 115 VAC/15 A Feed-through power Outlet Module (400) shown on FIG. 29.

Figure 35:
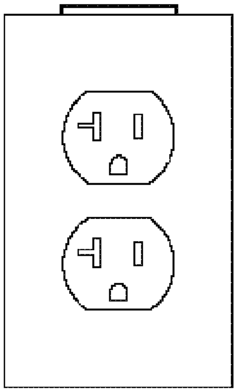

FIG. 35—Illustrates front view of dual 115 VAC/20 A power Outlet Module (402) with power plug IEC C20 (403) for connecting to incoming 115 VAC/20 A power supply cable. Both power Outlets (405), as shown, could be NEMA 5-20R.

Figure 36:
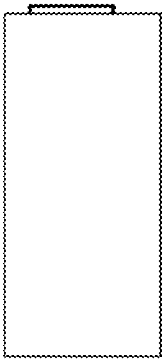

FIG. 36—Illustrates side view of dual 115 VAC/20 A power Outlet Module (402) shown on FIG. 35.

Figure 37:
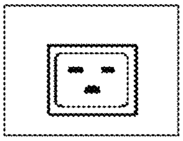

FIG. 37—Illustrates top view of dual 115 VAC/20 A power Outlet Module (402) shown on FIG. 35.

Figure 38:
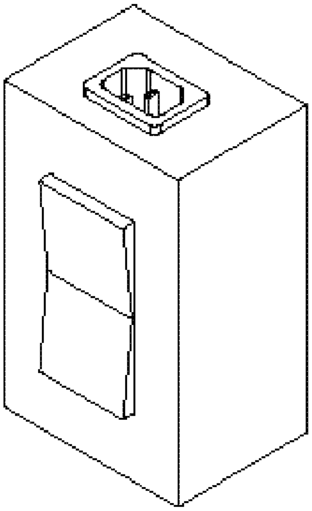

FIG. 38—Illustrates 3-D view of 115 VAC/15 A power Switch Module (407) with power plug IEC320 C14 (401) for connecting to incoming 115 VAC/15 A power supply cable and power outlet IEC320 C13 (406), which could be used for connecting switched 115 VAC/15 A power to the next Module or device, as needed.

Figure 39:
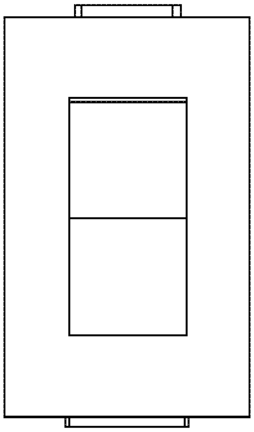

FIG. 39—Illustrates front view of 115 VAC/15 A power Switch Module (407) shown on FIG. 38

Figure 40:
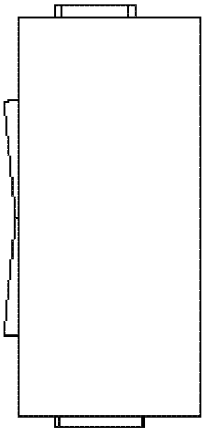

FIG. 40—Illustrates side view of 115 VAC/15 A power Switch Module (407) shown on FIG. 38

Figure 41:
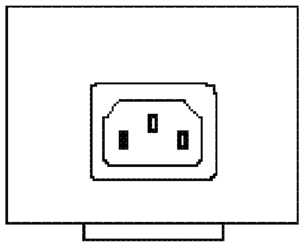

FIG. 41—Illustrates top view of 115 VAC/15 A power Switch Module (407) shown on FIG. 38

Figure 42:
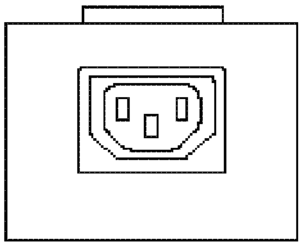

FIG. 42—Illustrates bottom view of 115 VAC/15 A power Switch Module (407) shown on FIG. 38

Figure 43:
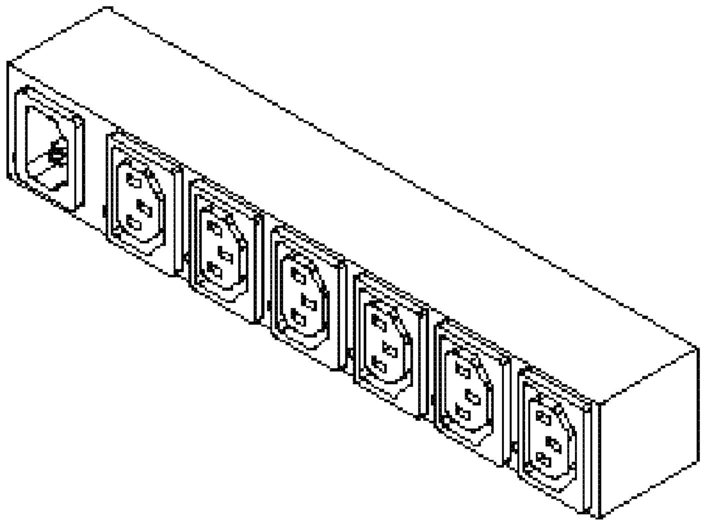

FIG. 43—Illustrates 3-D view of 115-230 VAC/15 A power Distribution Module (408) with power plug IEC320 C14 (401) for connecting to incoming 115-230 VAC/15 A power supply cable and six power outlets IEC320 C13 (406), which could be used for connecting 115-230 VAC/15 A power to Modules and/or devices, as needed. The illustrated design could differ from the existing designs by offering optional shielding, conditioning, environmental seal, etc.

FIG. 44 through FIG. 48 (4 pages)—illustrates mechanical packaging of an Electrical Panel, which could be used for variety of applications, including residential housing projects, etc.

For simplicity:

a) Only major components for power distribution of 115 VAC 15 A and 20 A are shown
b) Earth ground wire connections to the Panel and its respective components, as required by national and/or local safety agencies, are not shown
c) Mechanical mounting of respective components As required, the entire design of an Electrical Panel could be designed based on Plug-n-Power, Plug-n-Safety, Power-Proof principals, which are defined and described in this application.

Figure 44:
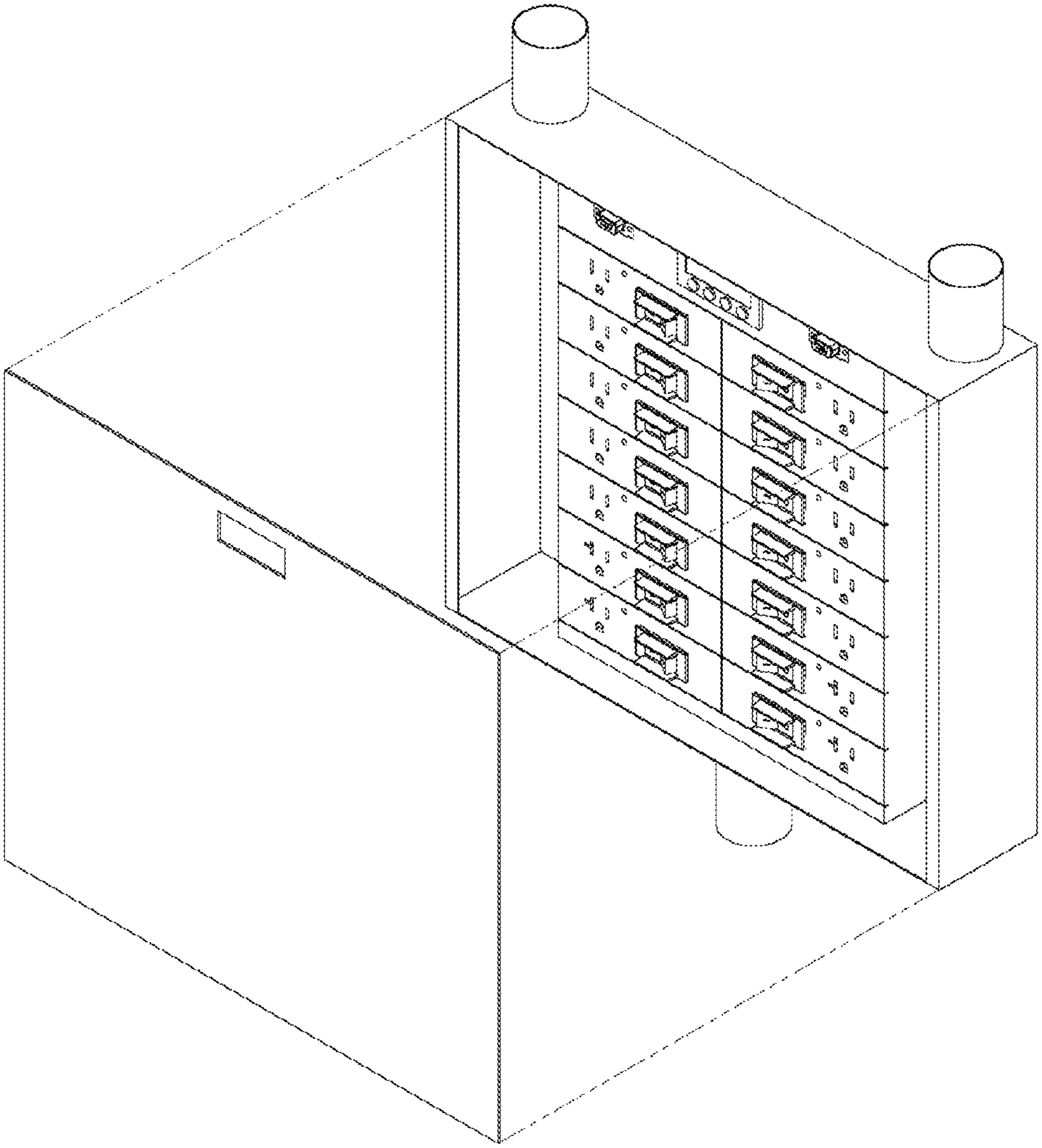

FIG. 44—Illustrates 3-D view of an Electrical Panel (409), which could have three functional sections: Power Distribution section of 115 VAC 15 A—ten outlets, which could be NEMA 5-15R, each protected by 115 VAC 15 A circuit-breaker switch; Power Distribution section of 115 VAC 20

A—four outlets, which could be NEMA 5-20R, each protected by 115 VAC 20 A circuit-breaker switch; Power Monitoring and Control Module for Electrical Panel (413), which could be designed to support any combination of the following functions: monitor incoming power to Electrical Panel (409); monitor and/or control power consumption by each or all power distribution sections of (409); interface to local or remote Controller via hi-speed serial interface wired or wireless—connection (414); interface to Utility company LAN, as needed, connection (415); Power Monitor user interface could allow entry of desired limits in regard to: power consumption; power availability to each or all sections as function of real time; remote control access by other Controller within the System; etc.

FIG. elements are labeled as follows:

411—opening in the Electrical Panel (409) enclosure for incoming power interface

412—openings in the Electrical Panel (344) enclosure for power distribution cables to exit the Electrical Panel (409) to provide power to respective Modules.

Figure 45:
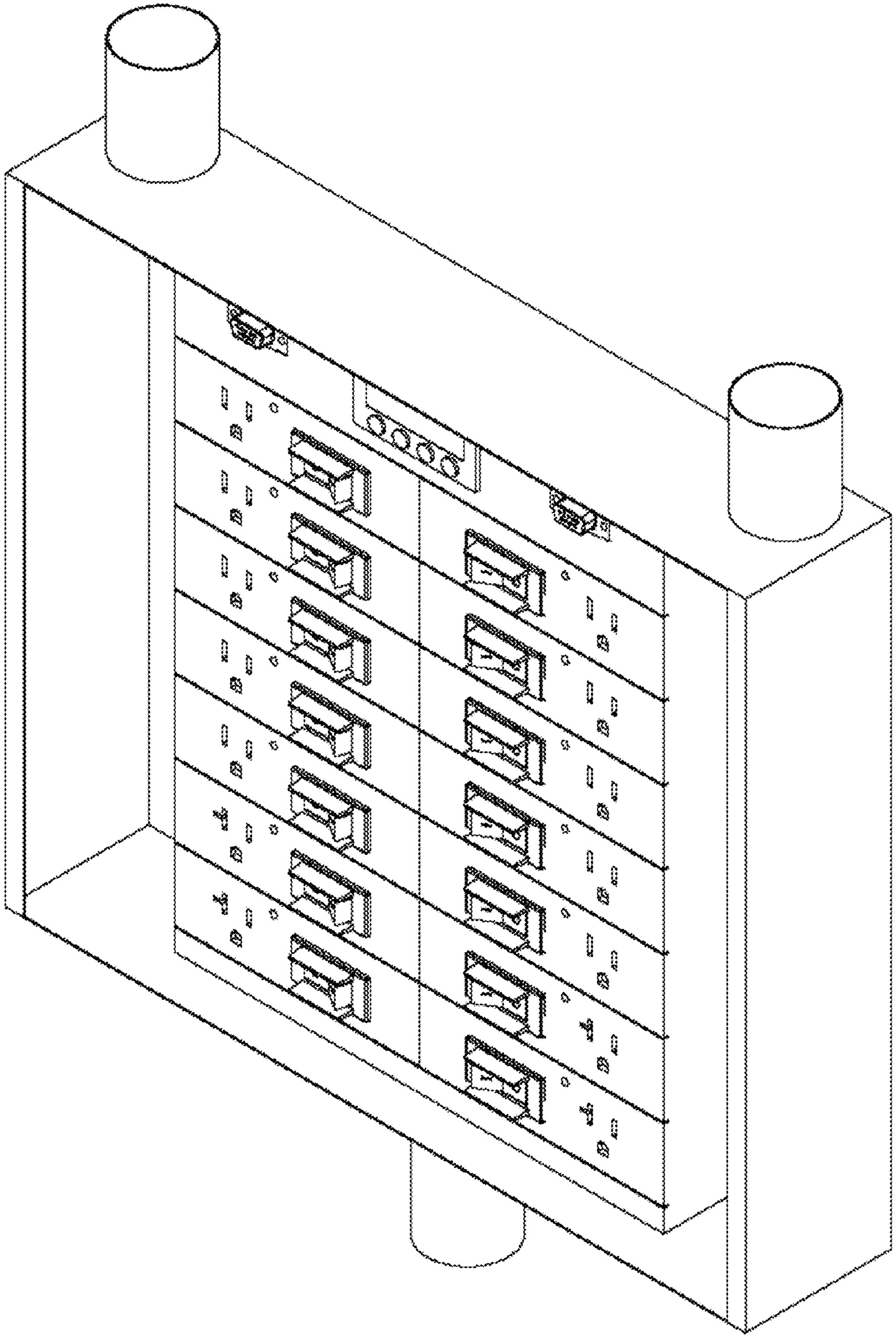
Figure 46:
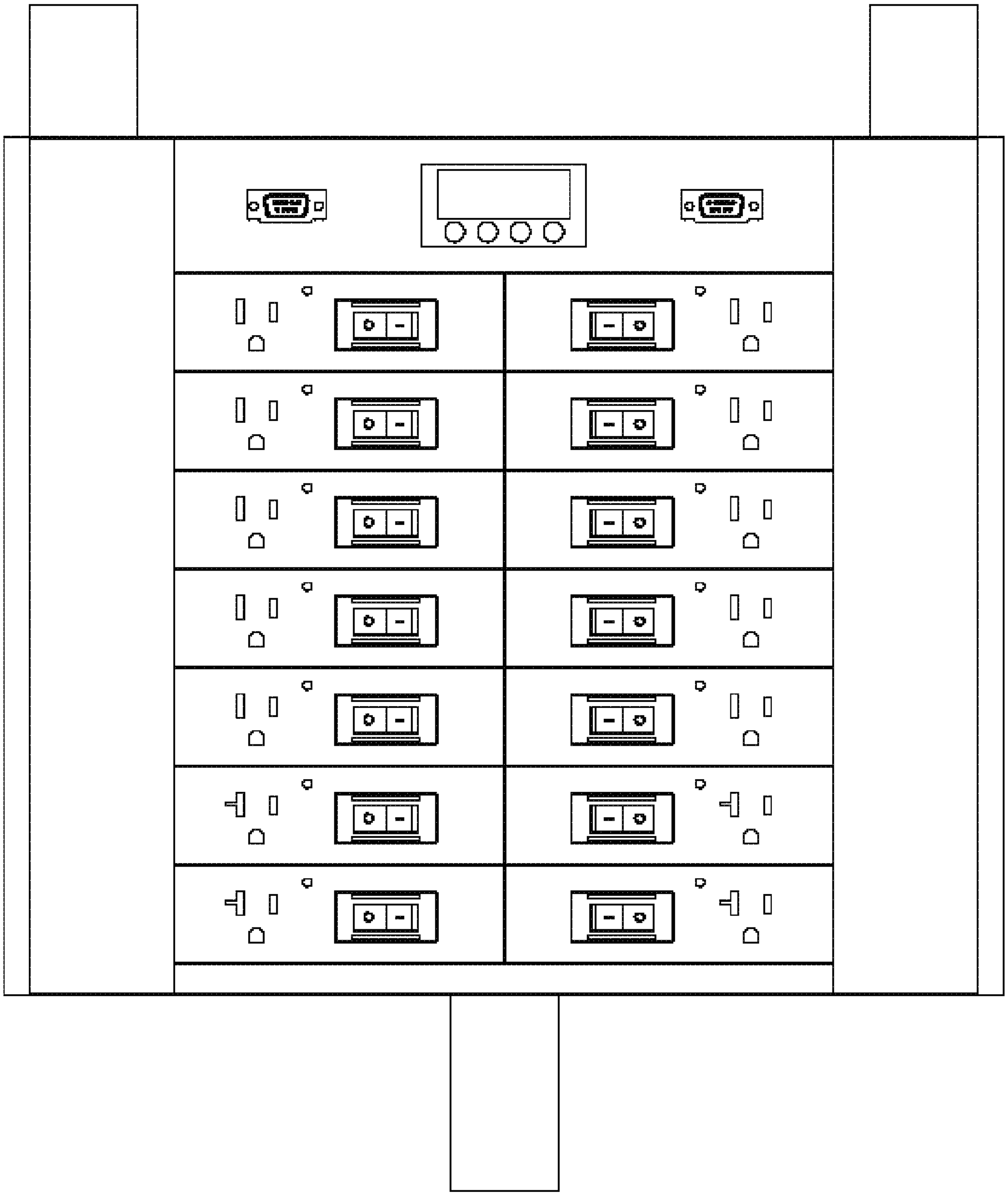

410—Front Cover of Electrical Panel (409) with a see-through window (416), which could be used for viewing status of the Power Monitor (413), when Front Cover (410) is installed FIG. 45—Illustrates 3-D view of an Electrical Panel (409) without the front cover FIG. 46—Illustrates front view of an Electrical Panel (409) without front cover.

FIG. elements are labeled as follows:

417—115 VAC/15 A Power Module, which could include: 115 VAC/15 A disconnect breaker (418), NEMA 5-15R outlet (404), etc.

421—115 VAC/20 A Power Module, which could include: 115 VAC/20 A disconnect breaker (422), NEMA 5-20R outlet (405), etc.

420—one of the sections, which could be used for routing power cables connected to the Panel (409) to various loads, such as: Power Modules, etc.

Remaining elements are labeled same as on FIG. 44.

Figure 47:

FIG. 47—Illustrates top view of an Electrical Panel (409)

Figure 48:
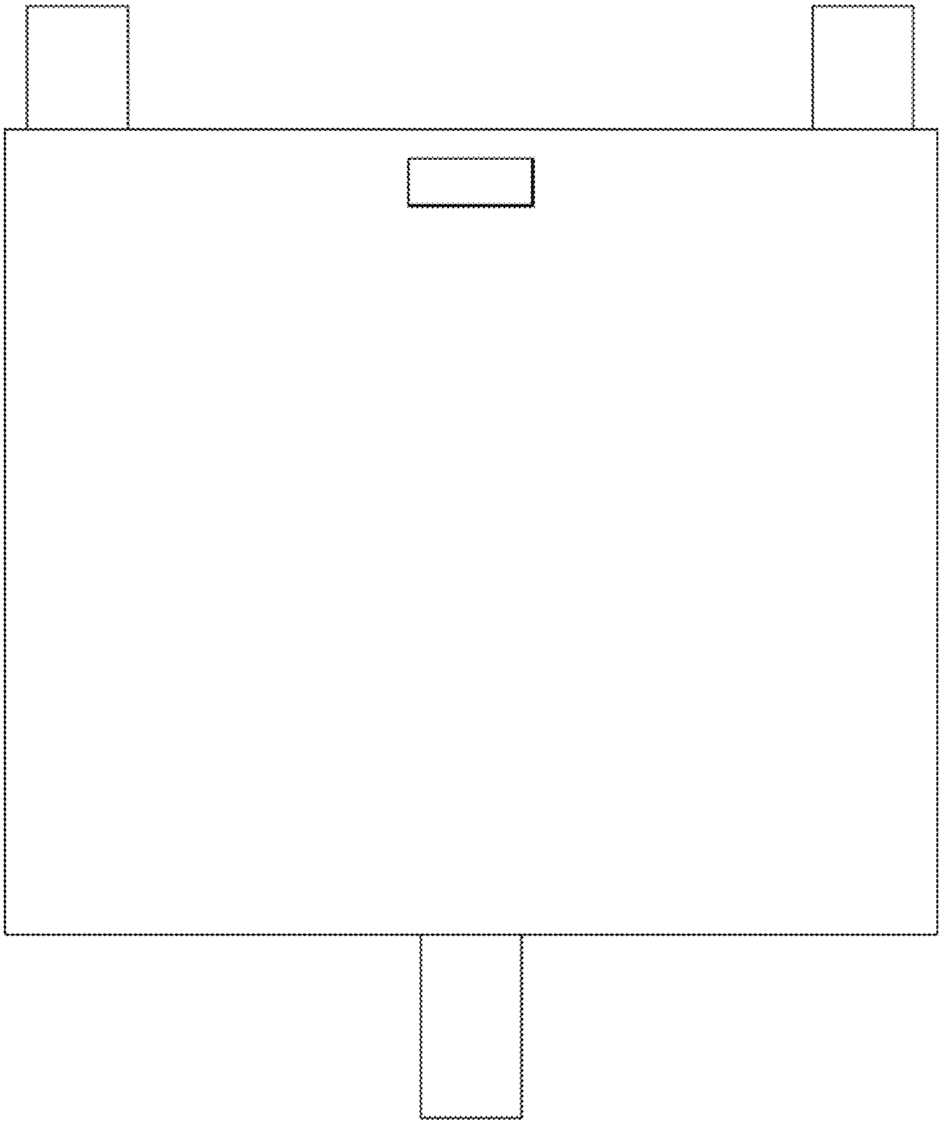

FIG. 48—Illustrates front view of an Electrical Panel (409)

The invention claimed is:

1. An intelligent modular power control and power distribution apparatus comprising:

(A) at least one configurable main power distribution and control module;

(B) at least one configurable secondary power distribution and control module;

(C) at least one configurable controller module;

(D) at least one configurable power strip module;

(E) at least one configurable power outlet module;

(F) at least one configurable power control switch module;

(G) at least one configurable power distribution and power control interface;

wherein (A) is configured for receiving input power to the apparatus, and is further configured to interface with (G) providing output power distribution and output power control for at least one module of the apparatus, and comprising:

(A1) at least one power input interface configured for connecting input power to (A);

(A2) at least one power output connector configured for mating with an input connector of (G) and providing output power from (A) to a module of the apparatus connected to an output connector of said (G);

(A3) at least one power control component configured for controlling output power of at least one (A2);

(A4) at least one interface between (A1), (A2), (A3), (A5), and the interface consisting of at least one of a plurality of: discrete wires, cables, printed circuit boards, connectors;

(A5) at least one programmable power controller configured for controlling at least one or more of the following power attributes of (A) including: voltage, current, and comprising:

a programmable control electronics of (A) configured for interfacing with an user interface of (A), and for controlling power of at least one (A2);

a plurality of sensors of (A) configured for monitoring the power attributes of said (A), and for monitoring ambient environment surrounding said (A), and for providing monitored data to said programmable control electronics of (A);

said user interface of (A) configured for programming said programmable control electronics of (A), and said user interface of (A) connected to said programmable control electronics of (A) via at least one of a network, wireless, wired cable connection or the INTERNET;

a non-volatile memory configured for interfacing with said programmable control electronics of (A), and storing trigger points for different sensor conditions, and storing acceptance criteria of said power attributes of (A), and storing control algorithm executed in real-time by said programmable control electronics of (A) maintaining said power attributes within said acceptance criteria;

wherein (B) is configured for interfacing with at least one output connector of (G) providing input power to (B) from at least one module of the apparatus, and is further configured for interfacing with at least one input connector of (G) providing output power distribution and output power control for at least one module of the apparatus, and comprising:

(B1) at least one power input connector configured for mating with a power output connector of (G), and for receiving input power to (B) from said (G);

(B2) at least one power output connector configured for mating with an input connector of (G) providing output power from said (B2) to at least one module of the apparatus connected to an output connector of said (G);

(B3) at least one power control component configured for controlling output power of at least one (B2);

(B4) at least one interface between (B1), (B2), (B3), (B5), and the interface consisting of at least one of a plurality of: discrete wires, cables, printed circuit boards, connectors;

(B5) at least one programmable power controller configured for controlling at least one or more of the following power attributes of (B) including: voltage, current, and comprising:

a programmable control electronics of (B) configured for interfacing with an user interface of (B), and for controlling power of at least one (B2);

a plurality of sensors of (B) configured for monitoring the power attributes of (B), and for monitoring ambient environment surrounding (B), and for providing monitored data to said programmable control electronics of (B);

said user interface of (B) configured for programming the said programmable control electronics of (B), and said user interface of (B) is connected to said programmable control electronics of (B) via at least one of a network, wireless, wired cable connection or the INTERNET;

a non-volatile memory configured for interfacing with said programmable control electronics of (B), and storing trigger points for different sensor conditions, and storing acceptance criteria of said power attributes of (B), and storing control algorithm executed in real-time by said programmable control electronics of (B) maintaining said power attributes of (B) within said acceptance criteria;

wherein (C) is configured as a host controller of the apparatus controlling a programmable power controller of at least one module of the apparatus, and said host controller receives power attributes from said programmable power controller, and said host controller compares in real-time said power attributes with an acceptance criteria stored in a non-volatile memory of said host controller, and based on results of said comparison, said host controller controls said programmable power controller and maintains said power attributes of said module within said acceptance criteria, and comprising:

a programmable computer of (C) configured for interfacing with an user interface of the apparatus, and for controlling said programmable power controller of a module within the apparatus;

said user interface of (C) configured for programming said programmable computer of (C), and said user interface of (C) is connected to said programmable computer of (C) via at least one of a network, wireless, wired cable connection or the INTERNET;

a non-volatile memory configured for interfacing with said programmable computer of (C), and storing acceptance criteria of the power attributes of the apparatus, and storing a control algorithm executed in real-time by said programmable computer of (C) maintaining the power attributes of the apparatus within the acceptance criteria;

wherein (D) is configured for interfacing with at least one output connector of (G) providing input power to (D) from at least one module of the apparatus, and is further configured for interfacing with at least one input connector of (G) providing output power distribution and output power control from (D) for at least one module of the apparatus, and is further configured with an enclosure for mounting at least one input power connector of (D) and at least one power control component of (D) on side one of said enclosure, and for mounting at least one output power connector of (D) on the side two of said enclosure opposite to the side one, and comprising:

(D1) at least one power input connector configured for mating with a power output connector of (G), and for receiving input power from said (G);

(D2) at least one power output connector configured for mating with an input connector of (G) providing output power from said (D2) to at least one module of the apparatus connected to an output connector of said (G);

(D3) at least one power switch configured for controlling output power of at least one (D2);

(D4) at least one interface between (D1), (D2), (D3), (D5), and the interface consisting of at least one of a plurality of: discrete wires, cables, printed circuit boards, connectors;

(D5) at least one programmable power controller configured for controlling at least one or more of the following power attributes of said (D) including: voltage, current, and comprising:

a programmable control electronics of (D) configured for interfacing with an user interface of (D), and for controlling power of at least one (D2);

a plurality of sensors of (D) configured for monitoring said power attributes of at least one (D2), and for monitoring ambient environment surrounding (D), and for providing monitored data to said programmable control electronics of (D);

said user interface of (D) configured for programming the said programmable control electronics of (D), and said user interface of (D) connected to said programmable control electronics of (D) via at least one of a network, wireless, wired cable connection or the INTERNET;

a non-volatile memory configured for interfacing with said programmable control electronics of (D), and storing trigger points for different sensor conditions, and storing acceptance criteria of said power attributes, and storing control algorithm executed in real-time by said programmable control electronics of (D) maintaining said power attributes of (D) within said acceptance criteria;

(D6) an enclosure configured for mounting (D1), (D3) and said user interface of (D5) on side one of the enclosure, and mounting (D2) on side two of said enclosure opposite to said side one, and said side one is further configured for attaching (D) to a mounting surface with a provision on said mounting surface to have cut-outs allowing access to said (D1), (D3) and said user interface of (D5);

wherein (E) is configured for interfacing with (G) providing input power to (E) from at least one module of the apparatus, and is further configured for interfacing with (G) providing output power distribution for at least one module of the apparatus, and is further configured to include at least one power outlet which is used by an user to plug-in an external device, and comprising:

(E1) at least one power input connector configured for mating with a power output connector of (G), and for receiving input power from said (G);

(E2) at least one power output connector configured for mating with an input connector of (G) providing output power from (E2) to at least one module of the apparatus connected to an output connector of said (G);

(E3) at least one power outlet connector configured for an user to plug-in an external device;

(E4) at least one interface between (E1), (E2), (E3), (E5), and the interface consisting of at least one of a plurality of: discrete wires, cables, printed circuit boards, connectors;

(E5) at least one programmable power controller configured for controlling at least one or more of the following power attributes of (E) including: voltage, current, and comprising:

a programmable control electronics of (E) configured for interfacing with an user interface of (E), and for controlling power of at least one (E2);

a plurality of sensors of (E) configured for monitoring said power attributes of at least one (E2), and for monitoring ambient environment surrounding (E), and for providing monitored data to said programmable control electronics of (E);

said user interface of (E) configured for programming said programmable control electronics of (E), and said user interface of (E) connected to said programmable control electronics of (E) via at least one of a network, wireless, wired cable connection or the INTERNET;

a non-volatile memory configured for interfacing with said programmable control electronics of (E), and storing trigger points for different sensor conditions, and storing acceptance criteria of said power attributes, and storing control algorithm executed in real-time by said programmable control electronics of (E) maintaining said power attributes of (E) within said acceptance criteria;

(E6) an enclosure configured for mounting (E3) and said user interface of (E5) on side one of the enclosure, and for mounting (E1) and (E2) on other sides of said enclosure excluding said side one, and said enclosure is further configured for mounting to a surface of a structure, and said surface providing access to said (E3) and said user interface of (E5) of said enclosure to an user facing said surface, and said structure hiding the other sides of said enclosure from said user facing said surface;

wherein (F) is configured for interfacing with (G) providing input power to (F) from at least one module of the apparatus, and is further configured for interfacing with (G) providing output power distribution for at least one module of the apparatus, and is further configured to include at least one power output connector controlled by at least one switch operated by an user, and comprising:

(F1) at least one power input connector configured for mating with a power output connector of (G), and for receiving input power from said (G);

(F2) at least one power output connector configured for mating with an input connector of (G) providing output power from (F2) to at least one module of the apparatus connected to an output connector of said (G);

(F3) at least one power output connector controlled by (F4) configured for mating with an input connector of (G) providing output power from (F3) to at least one module of the apparatus connected to an output connector of said (G);

(F4) at least one power control switch operated by an user, and said power control switch configured to control power to at least one (F3);

(F5) at least one interface between (F1), (F2), (F3), (F4), and the interface consisting of at least one of a plurality of: discrete wires, cables, printed circuit boards, connectors;

(F6) an enclosure configured for mounting (F4) on side one of said enclosure, and for mounting (F1), (F2) and (F3) on other sides of said enclosure excluding said side one, and said enclosure is further configured for mounting to a surface of a structure, and said surface providing access to said (F4) of said enclosure to an user facing said surface, and said structure hiding the other sides of said enclosure from said user facing said surface;

wherein (G) is configured for connecting power and controls between modules of the apparatus, and the connection is further configured to prevent exposed power carrying conductors including: stripped wires, leads, terminals, connectors from being accessible with bare hands, and comprising:

(G1) at least one input connector configured for connecting to at least one power output connector of a module of the apparatus;

(G2) at least one output connector configured for connecting to at least one power input connector of a module of the apparatus;

(G3) at least one cable configured for interconnecting the at least one (G1) and the at least one (G2);

(G4) support components including strain-reliefs for attaching (G1) and (G2) to a module of the apparatus.

2. The intelligent modular power control and power distribution apparatus of claim 1 further comprising: of modules and interfaces configured for a power control and distribution system of a residential building.

3. The intelligent modular power control and power distribution apparatus of claim 1 further comprising: of modules and interfaces configured for a power control and distribution system of a commercial building.

4. The intelligent modular power control and power distribution apparatus of claim 1 further comprising: of modules and interfaces configured for a power control and distribution system of an industrial building.

5. The intelligent modular power control and power distribution apparatus of claim 1 further comprising: of modules and interfaces configured for a power control and distribution system of a machinery.

6. The intelligent modular power control and power distribution apparatus of claim 1 further comprising: of host computer and power controllers interfaced as a programmable closed loop control system maintaining power attributes of said system within programmable acceptance criteria.

7. A method of configuring and controlling an intelligent modular power control and power distribution system consisting of:

configuring at least one of a plurality of modules consisting of power distribution panels, power strips, power outlets, power switches on said intelligent modular power control and power distribution system;

configuring at least one of said modules of said intelligent modular power control and power distribution system with a programmable controller;

configuring said intelligent modular power control and power distribution system with a host computer;

configuring a power and control interfaces of said intelligent modular power control and power distribution system for providing connection between said modules, and for providing connection between said modules and said host computer, and said power and control interfaces preventing exposed power carrying conductors including: stripped wires, leads, terminals, connectors from being accessible with bare hands;

programming, via an user interface, said programmable controller and said host computer on said intelligent modular power control and power distribution system;

receiving electrical signals to said programmable controller from at least one of plurality of sensors;

controlling at least one power component of a plurality of said modules electronically such that at least one or more of the following power attributes, power voltage, power current, power energy is controlled;

determining an optimized electrical configuration of at least one of a plurality of said modules by said programmable controller based at least in part on communications received from said host computer and the signals received by said plurality of sensors and further including data for power voltage, power current, power energy;

sending electrical control signals from said programmable controller to said power component of a module based upon data from said user interface, said host computer and said sensors; and configuring an enclosure on said modules on said intelligent modular power control and power distribution system, and said enclosure preventing exposed power carrying conductors including: stripped wires, leads, terminals, connectors from being accessible with bare hands.

8. The method of claim 7 further comprising: wherein said user interface is connected to said programmable controller via at least one of a network, wireless, wired cable connection or the INTERNET.

9. The method of claim 7 further comprising: storing trigger points for different sensor conditions, via said user interface, in a non-volatile storage medium of said programmable controller.

10. The method of claim 7 further comprising: storing acceptance criteria for at least one or more of the following power attributes, power voltage, power current, power energy, via said user interface, in said non-volatile storage medium of said programmable controller.

11. The method of claim 7 further comprising: storing control algorithm, via said user interface, in said non-volatile storage medium of said programmable controller, and said control algorithm comprising: controls executed by said programmable controller to maintain the at least one or more of said power attributes within said acceptance criteria.

12. The method of claim 7 further comprising: wherein the power and control interfaces between modules further comprising: pluggable cables, and wherein said modules are enclosed preventing exposed power carrying conductors including: stripped wires, leads, terminals, connectors from being accessible with bare hands.

13. The method of claim 7 further comprising: wherein said intelligent modular power control and power distribution system operates without a single exposed power carrying conductor including: stripped wires, leads, terminals, connectors accessible with bare hands.

14. The method of claim 7 further comprising: configuring and controlling said intelligent modular power control and power distribution system of a building with programmable controllers, and said programmable controllers comprising programmable closed loop control system maintaining power attributes of said intelligent modular power control and power distribution system within programmable acceptance criteria.

* * * * *